(12) United States Patent
Furukawa et al.

(10) Patent No.: US 7,081,387 B2
(45) Date of Patent: Jul. 25, 2006

(54) DAMASCENE GATE MULTI-MESA MOSFET

(75) Inventors: Toshiharu Furukawa, Essex Junction, VT (US); Jack A. Mandelman, Flat Rock, NC (US); Byeongju Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/918,949

(22) Filed: Aug. 16, 2004

(65) Prior Publication Data
US 2005/0012145 A1 Jan. 20, 2005

Related U.S. Application Data

(62) Division of application No. 10/262,190, filed on Oct. 1, 2002, now Pat. No. 6,818,952.

(51) Int. Cl.
*H01L 21/336* (2006.01)

(52) U.S. Cl. .................. 438/259; 257/63; 257/65; 257/192

(58) Field of Classification Search ................ 257/386, 257/387, 389, 63, 65, 192, 327, 616; 438/299
See application file for complete search history.

(56) References Cited

U.S. PATENT DOCUMENTS

| | | | |
|---|---|---|---|
| 5,122,848 A | 6/1992 | Lee et al. | |
| 5,675,164 A | 10/1997 | Brunner et al. | |
| 6,114,206 A | 9/2000 | Yu | |
| 6,245,619 B1 | 6/2001 | Boyd et al. | |
| 6,258,679 B1 | 7/2001 | Burns et al. | |
| 6,495,890 B1 * | 12/2002 | Ono | 257/387 |
| 6,509,586 B1 * | 1/2003 | Awano | 257/192 |
| 6,515,348 B1 | 2/2003 | Hueting et al. | |

FOREIGN PATENT DOCUMENTS

| | | |
|---|---|---|
| JP | 2002-009289 | 1/2002 |
| JP | 2002-094058 | 3/2002 |

OTHER PUBLICATIONS

B.J. Machesney, et al., "Corner Enhanced Field-Effect Transistor", IBM Technical Disclosure Bulletin, vol. 34, No. 12, May 1992 (pp. 101-102).

* cited by examiner

*Primary Examiner*—Mai-Huong Tran
(74) *Attorney, Agent, or Firm*—Scully, Scott, Murphy & Presser, P.C.; Joseph P. Abate, Esq.

(57) ABSTRACT

A multi-mesa FET structure with doped sidewalls for source/drain regions and methods for forming the same are disclosed. The exposure of the source and drain sidewalls during the manufacture enables uniform doping of the entire sidewalls especially when geometry-independent doping methods, such as gas phase doping or plasma doping, is used. The resulting device has depth independent and precisely controlled threshold voltage and current density and can have very high current per unit area of silicon as the mesas can be very high compared with mesas that could be formed in prior arts. Methods of providing multi-mesa FET structures are provided which employ either a damascene gate process or a damascene replacement gate process instead of conventional subtractive etching methods.

13 Claims, 42 Drawing Sheets

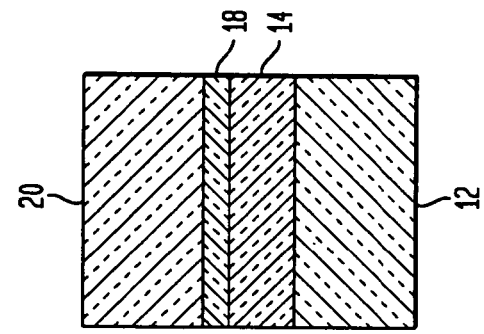
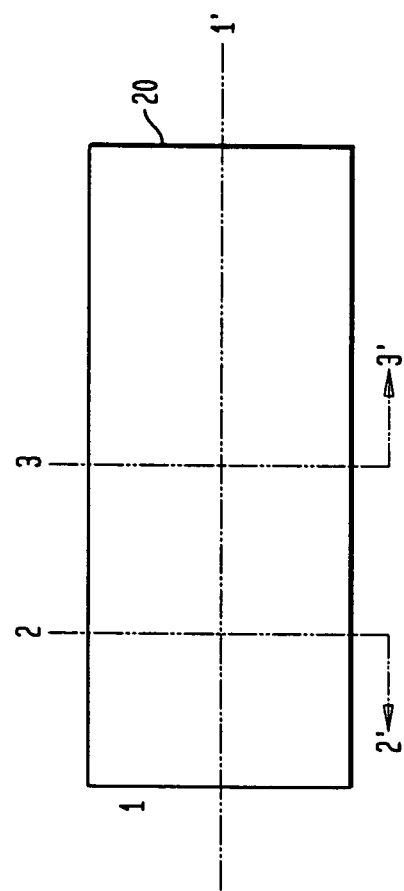
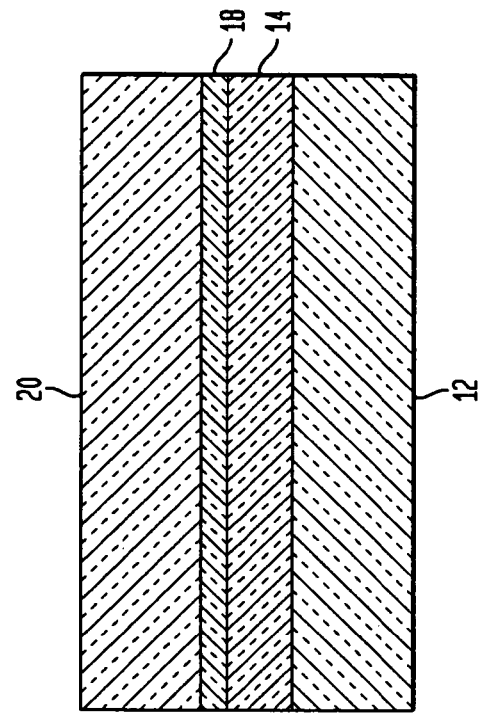
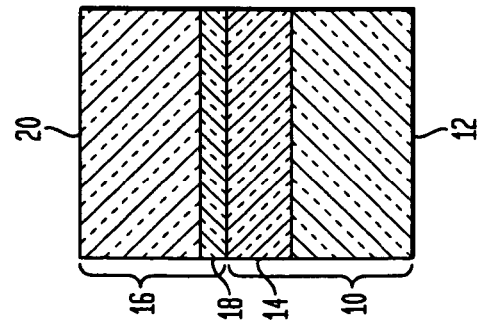

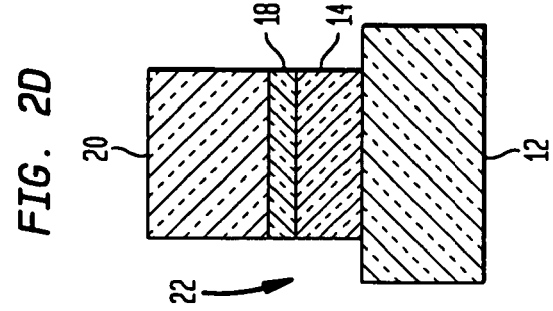
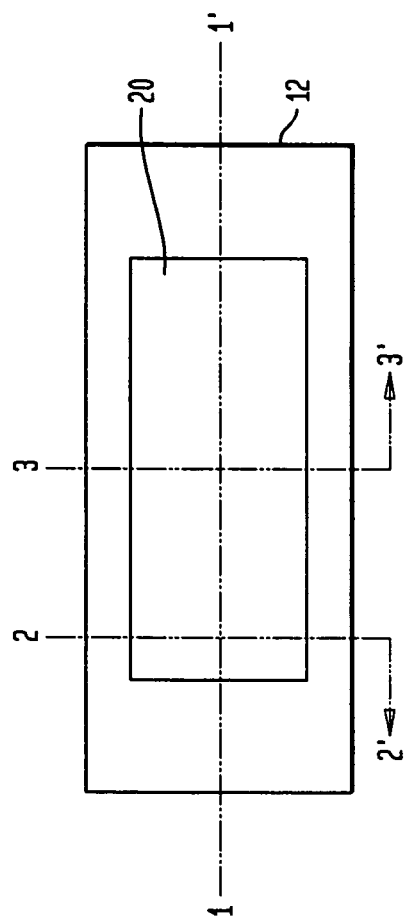
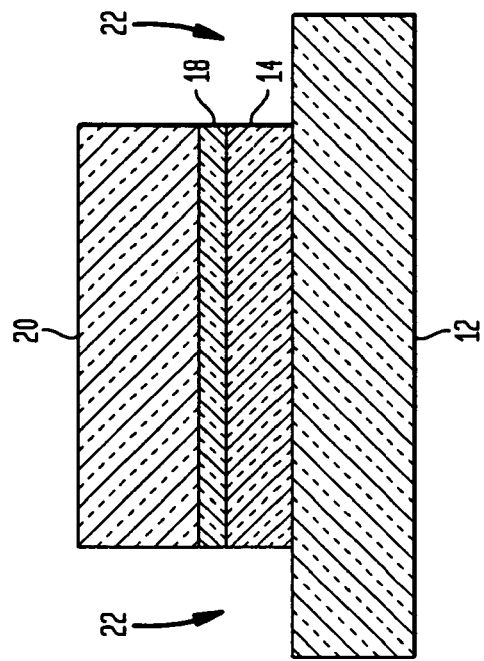
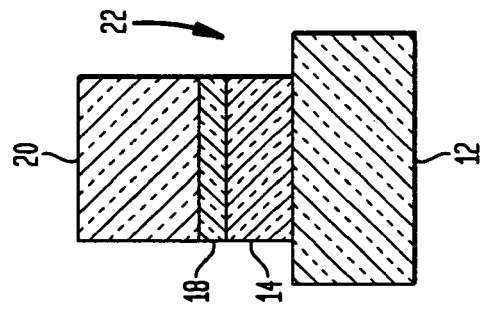

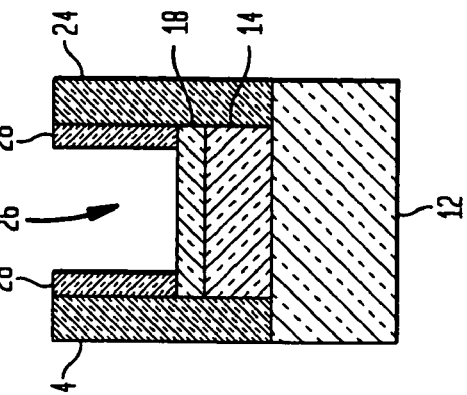
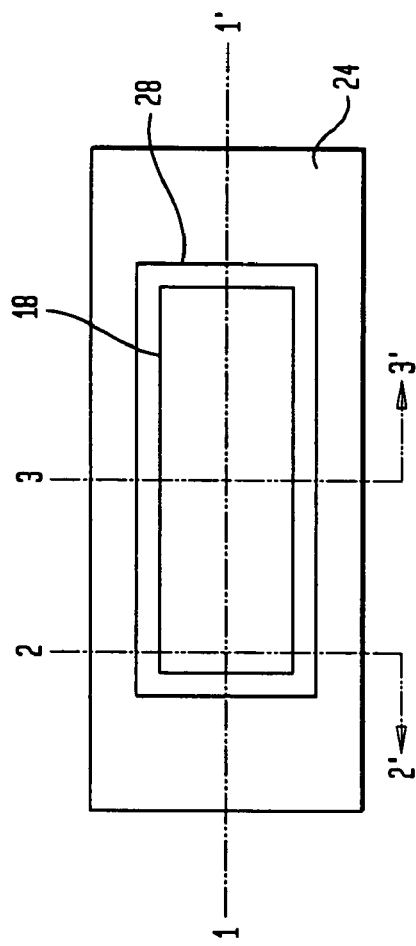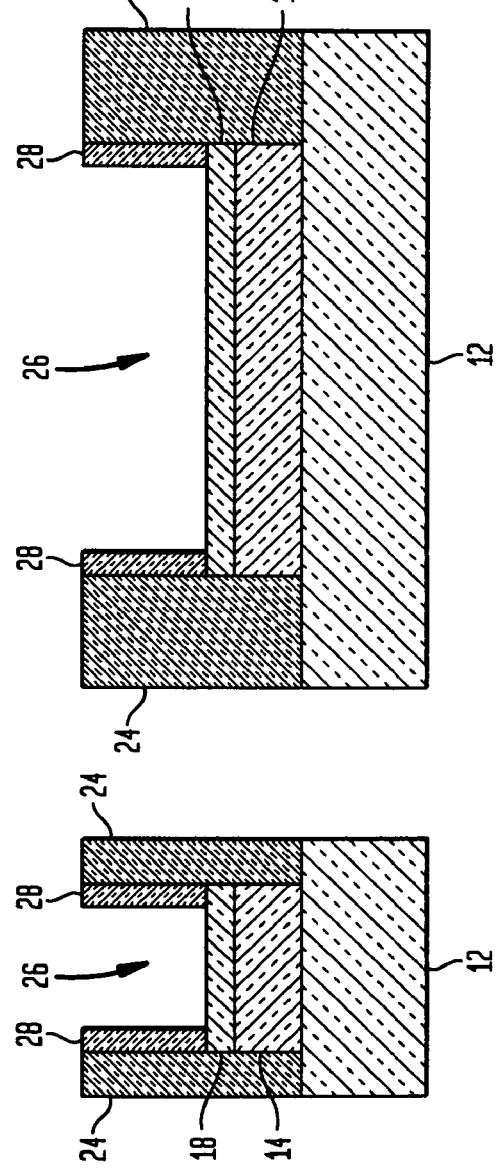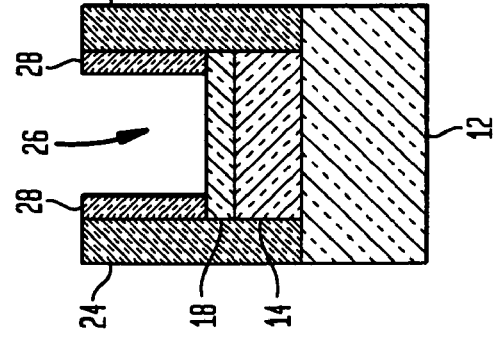

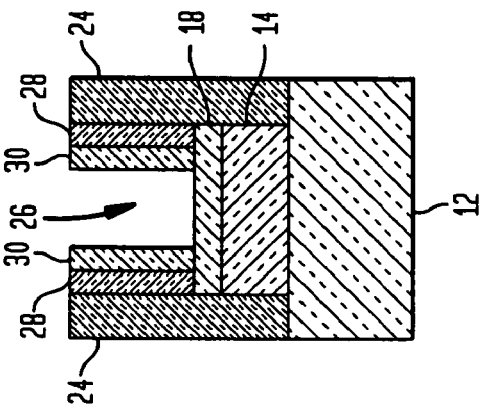
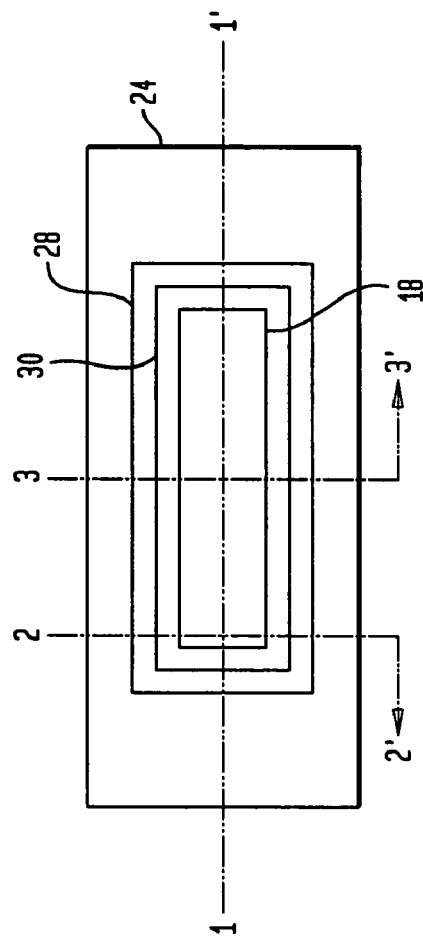
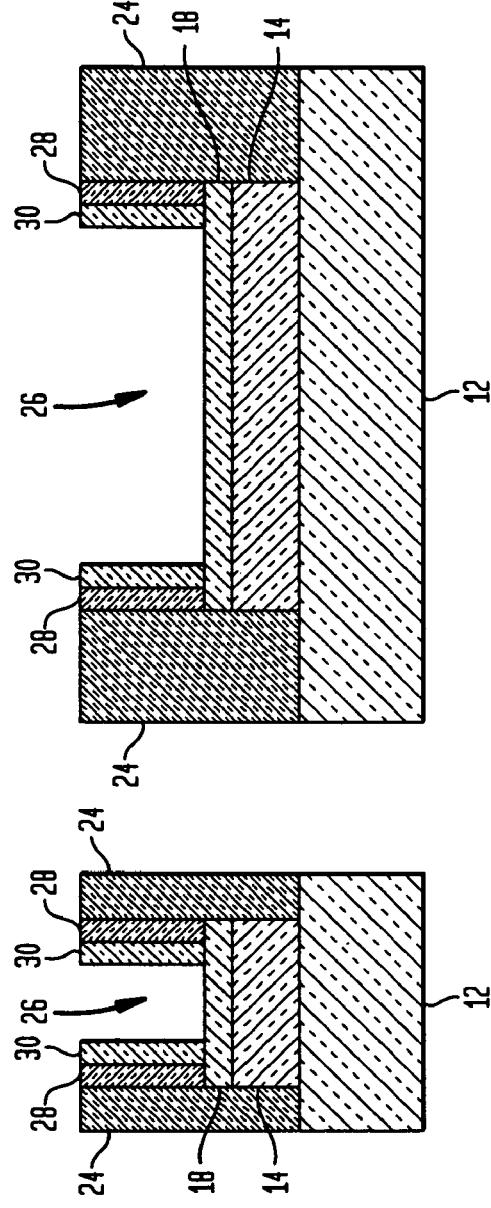

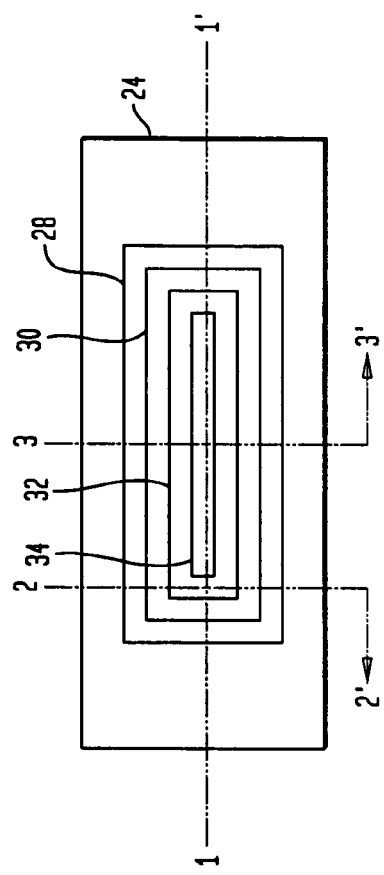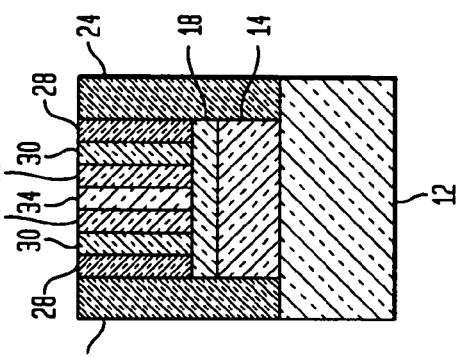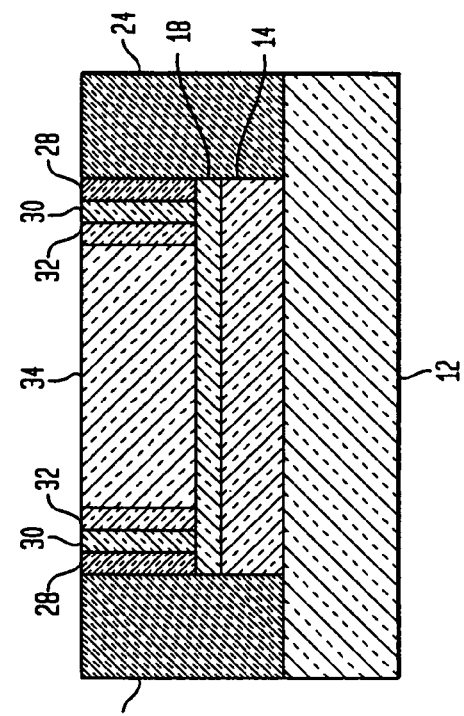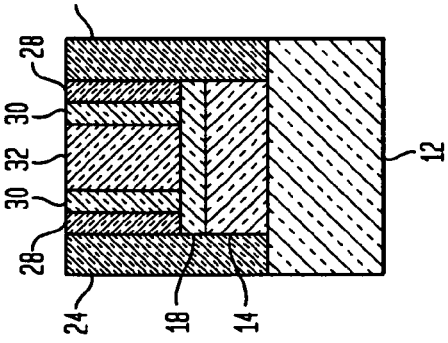
FIG. 9A
FIG. 9B
FIG. 9C
FIG. 9D

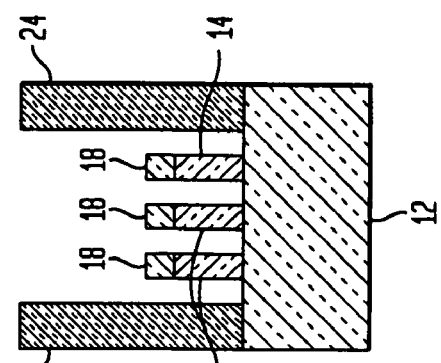
FIG. 12A
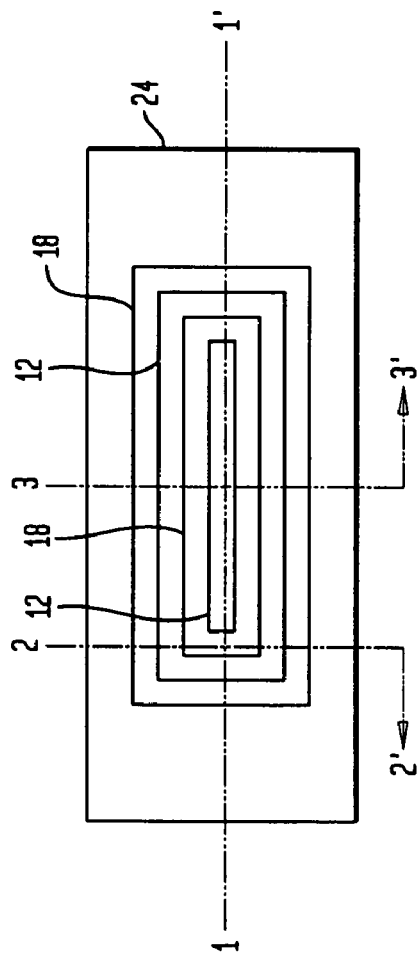
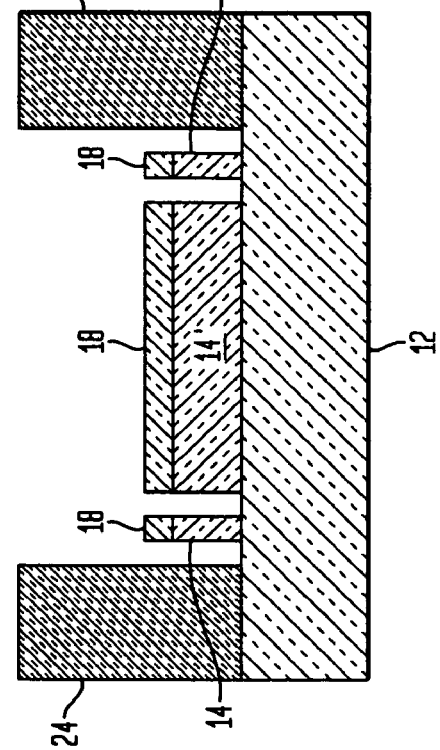
FIG. 12B
FIG. 12C
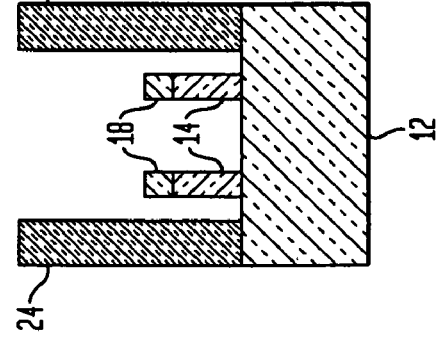
FIG. 12D

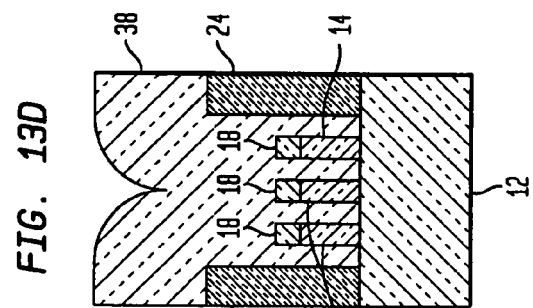
FIG. 13A
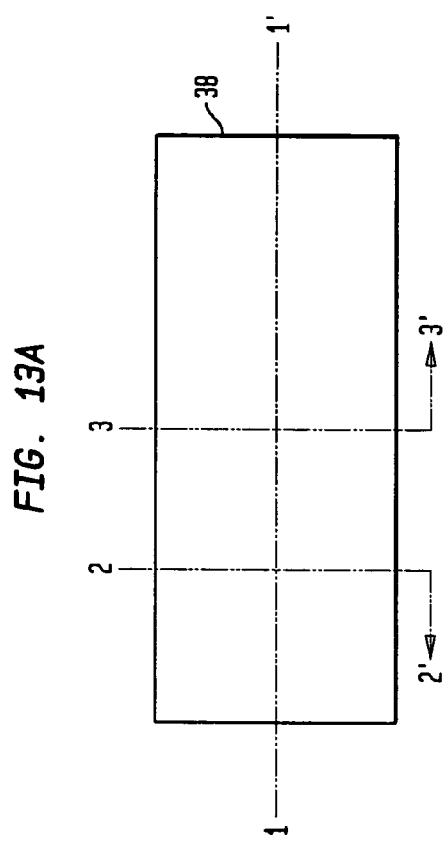
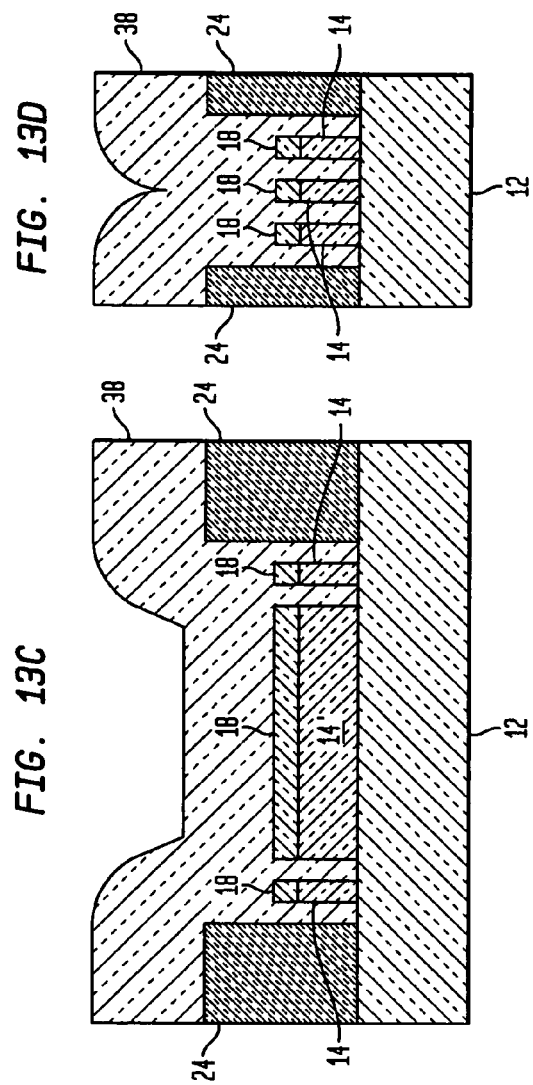
FIG. 13C
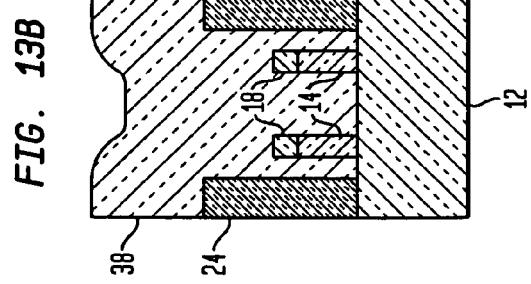
FIG. 13B
FIG. 13D

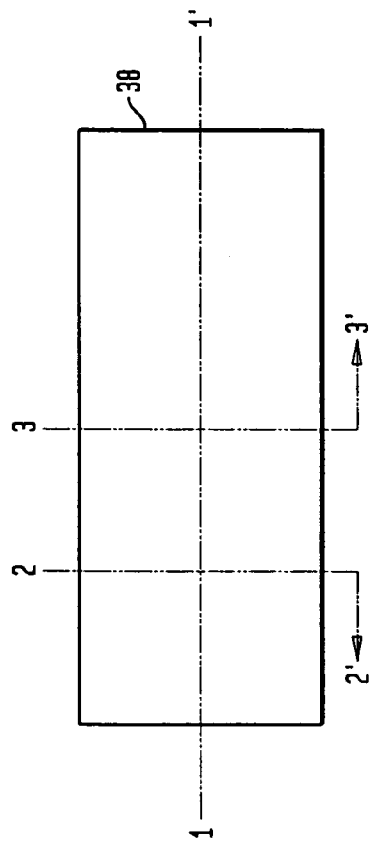
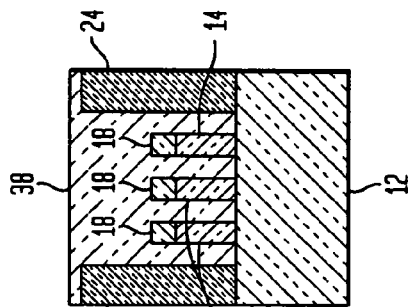
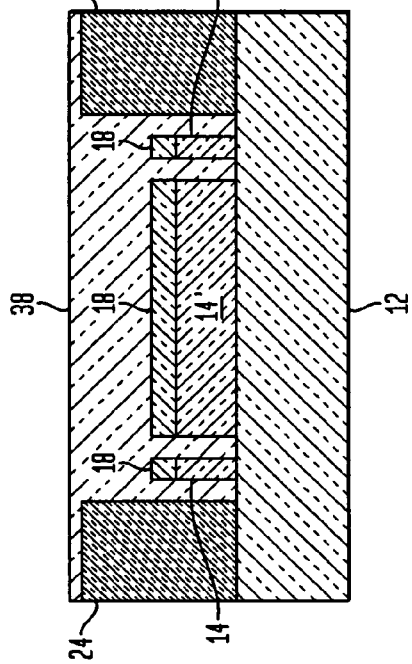
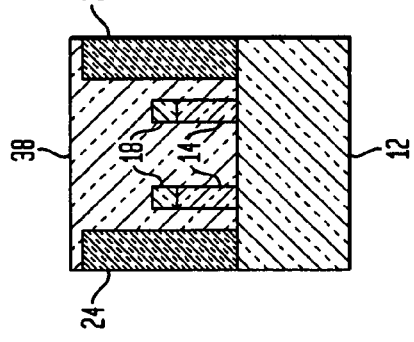

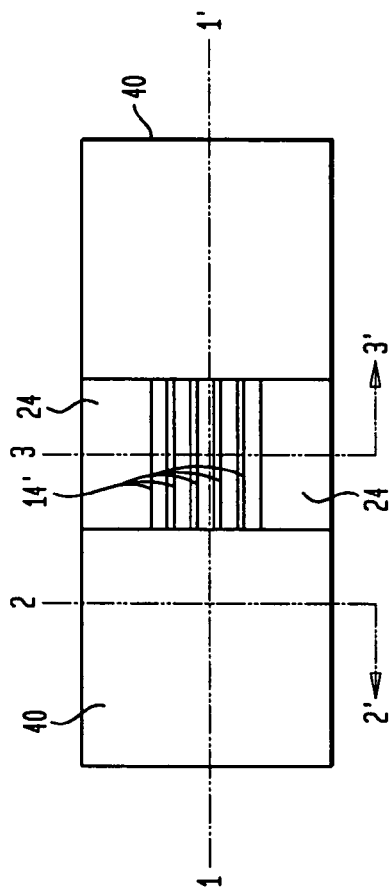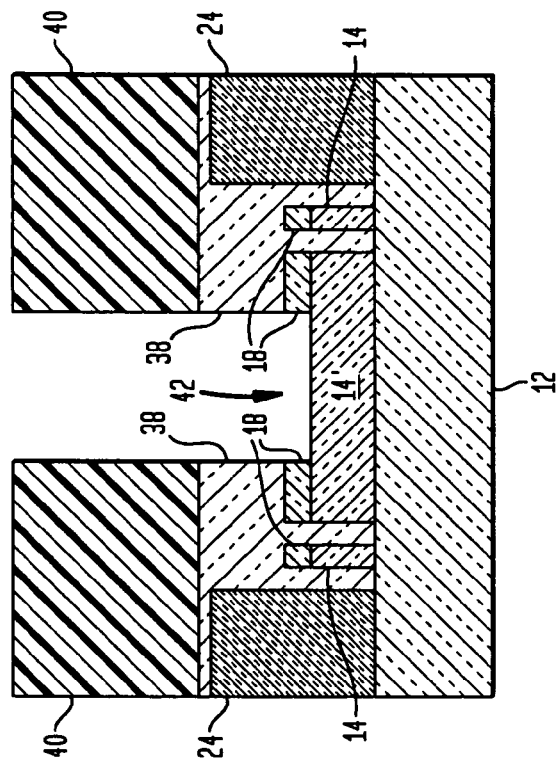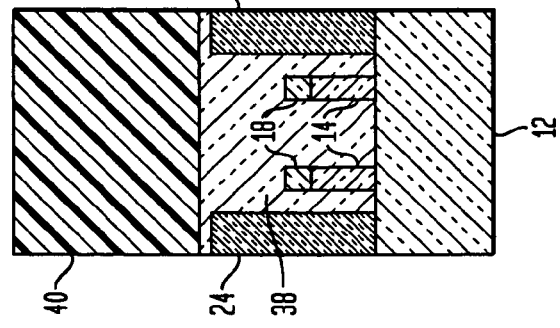

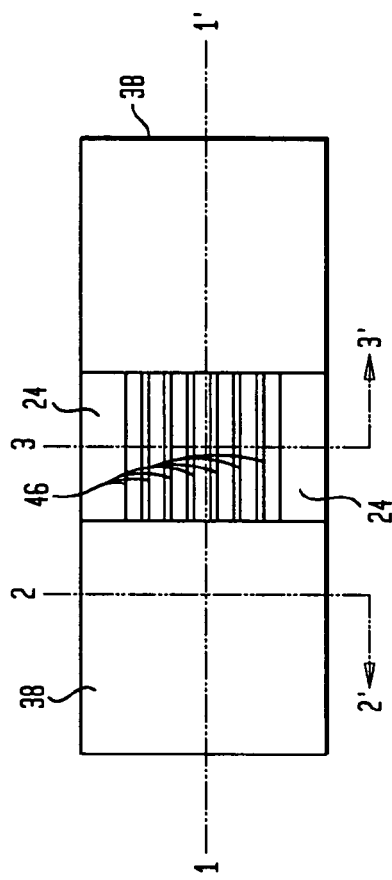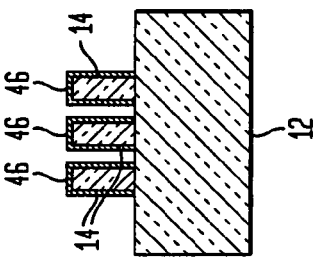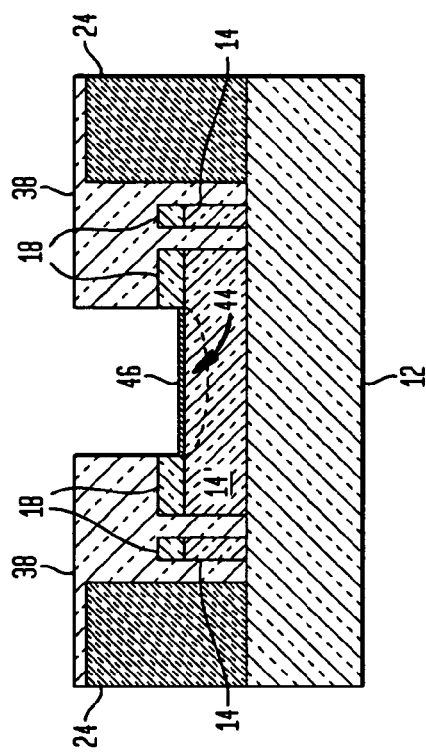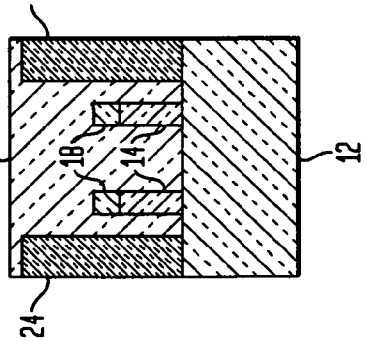
FIG. 16A
FIG. 16B
FIG. 16C
FIG. 16D

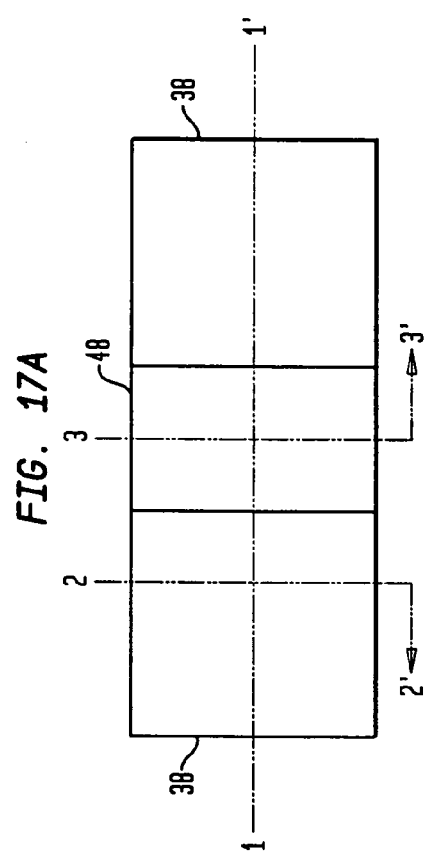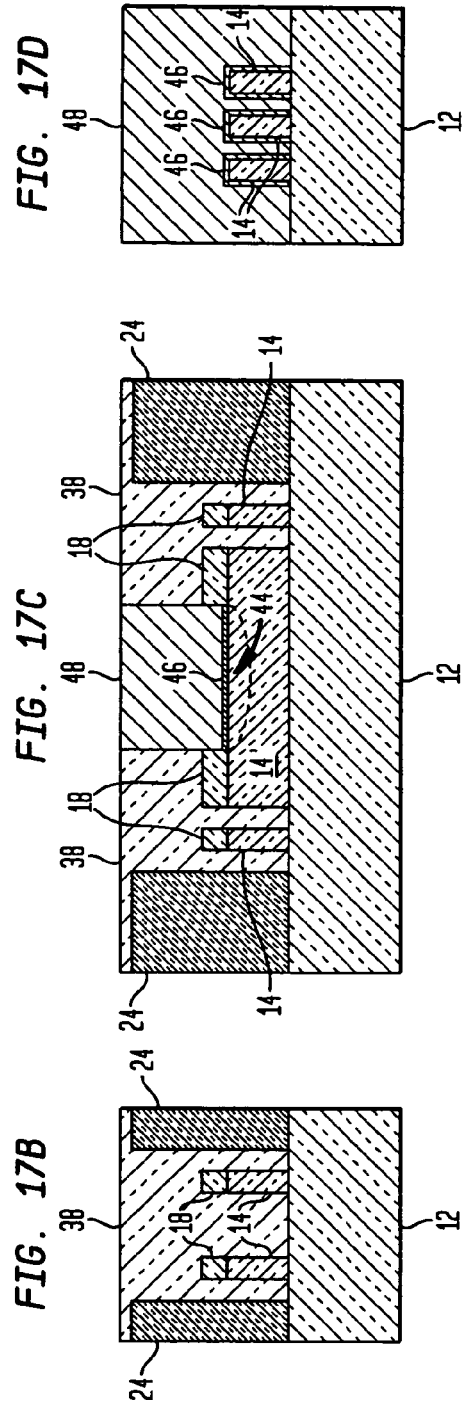

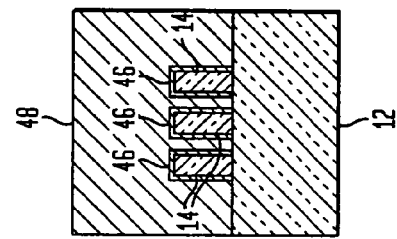
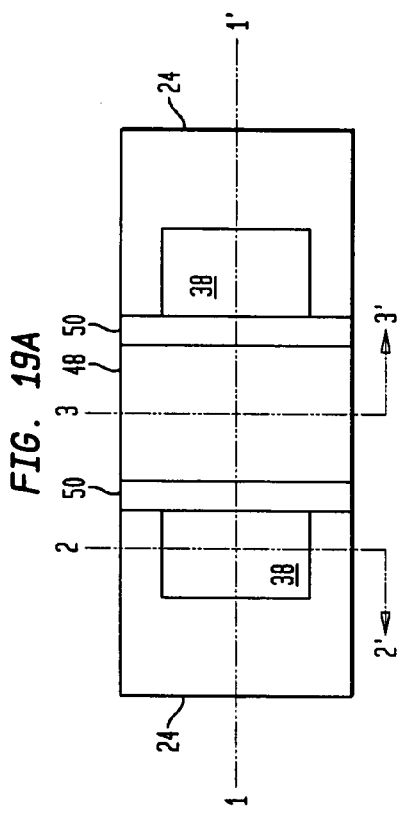
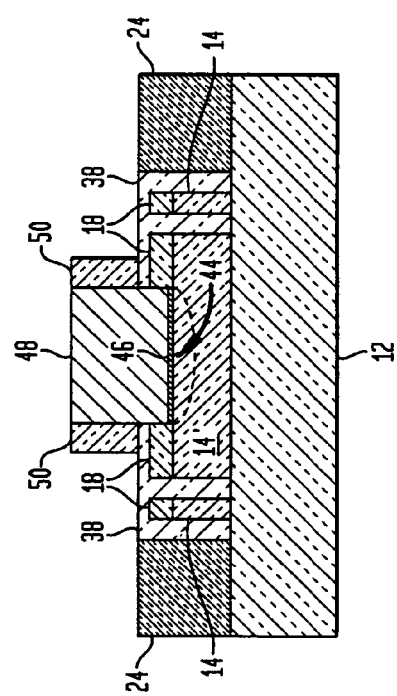
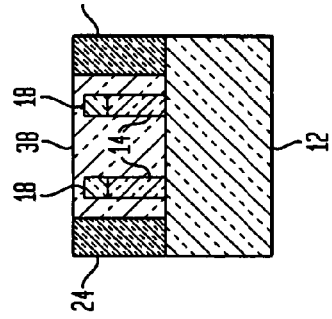

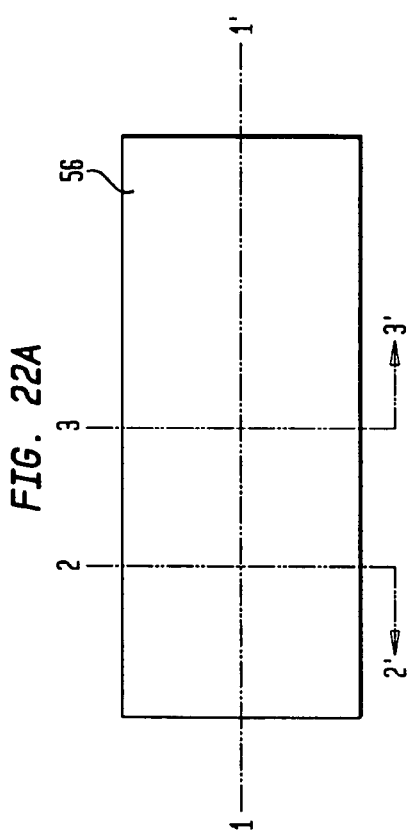
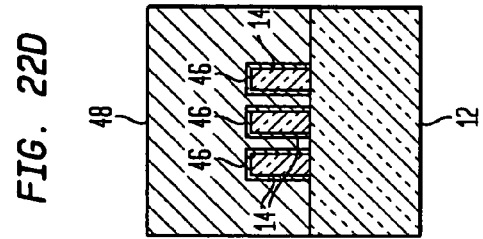
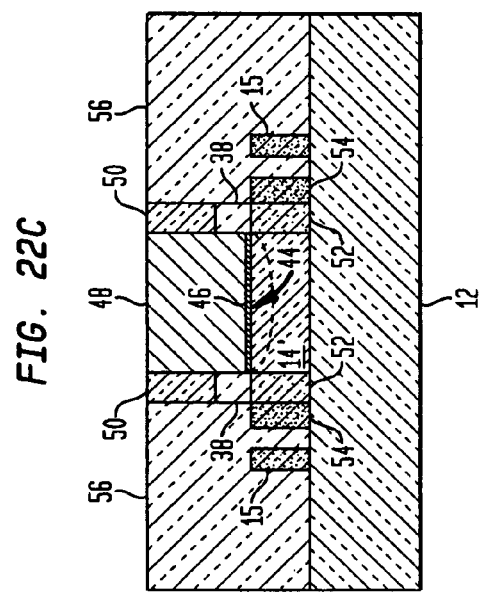
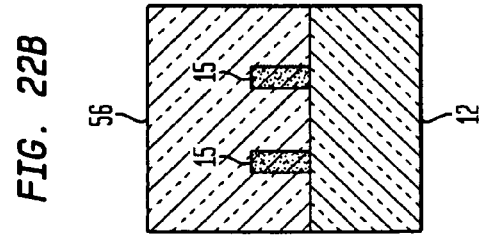

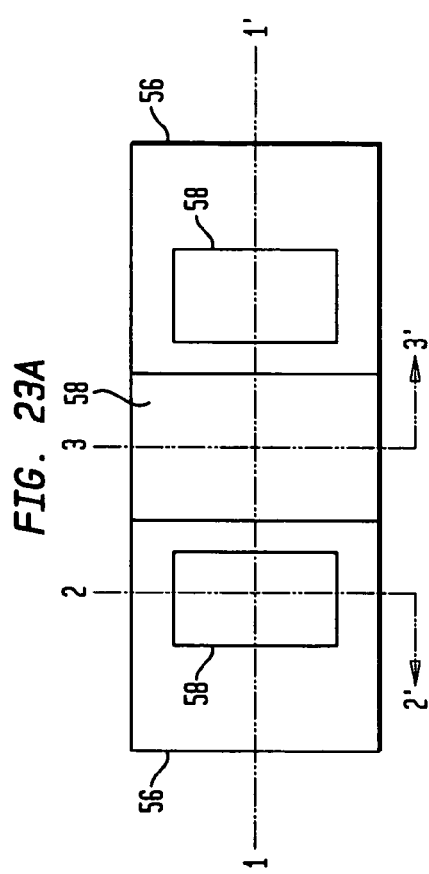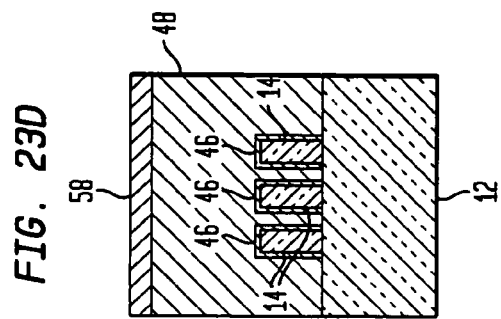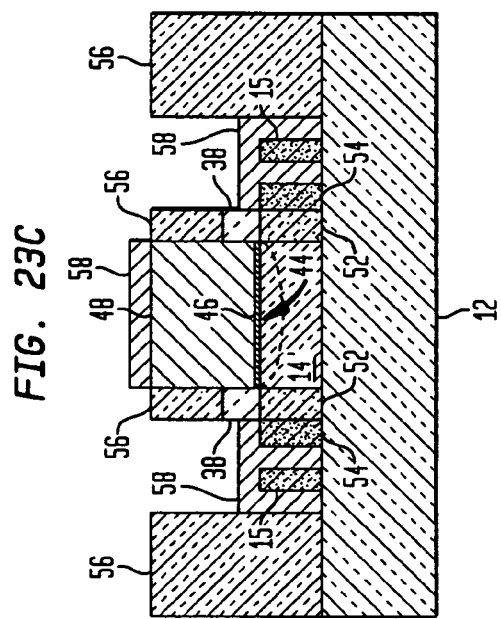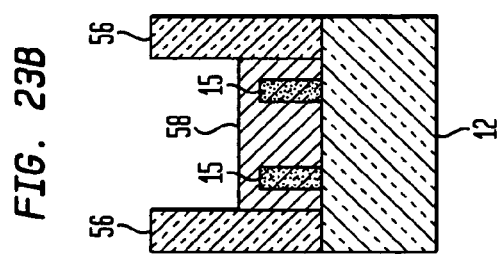

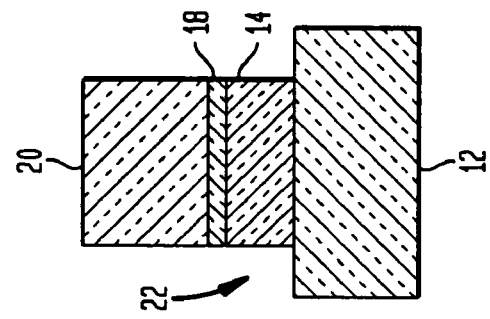
FIG. 26A
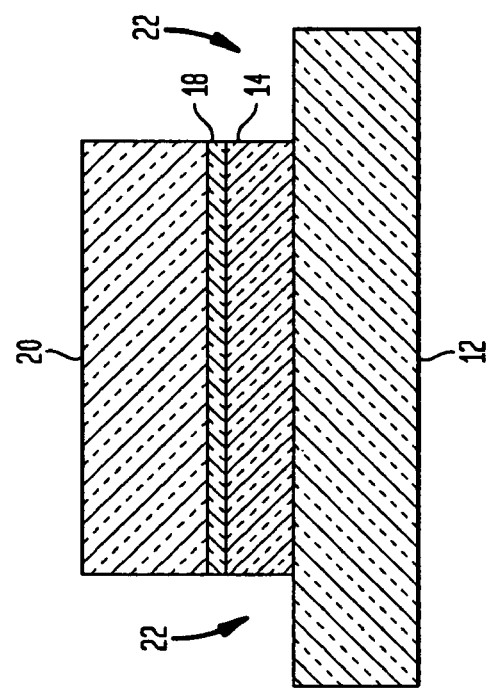
FIG. 26B
FIG. 26C
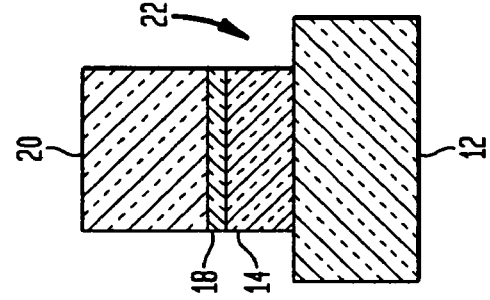
FIG. 26D

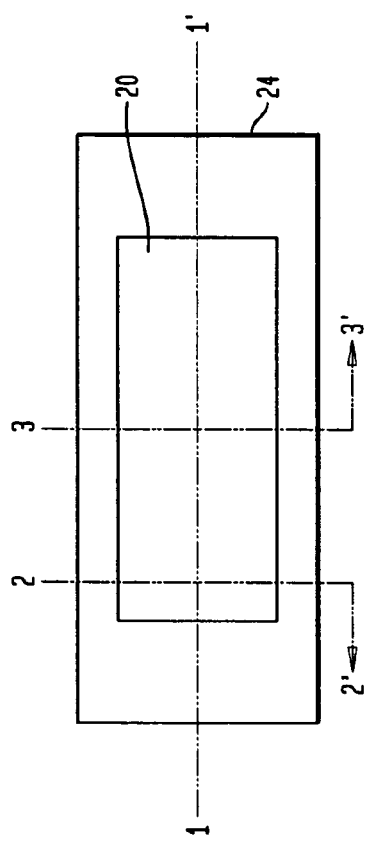
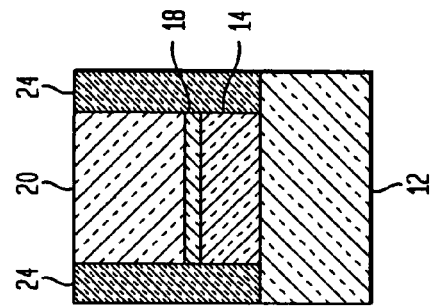
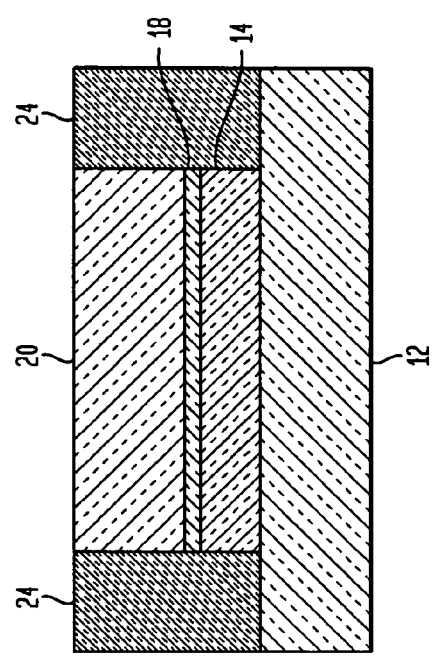
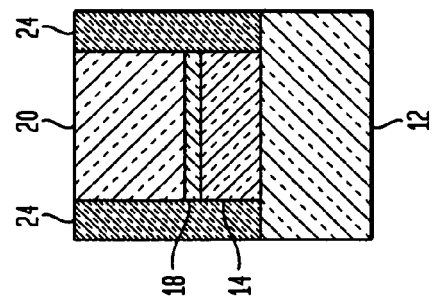

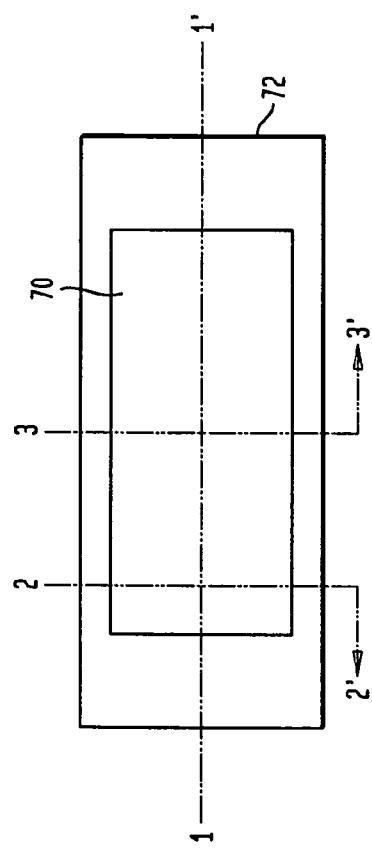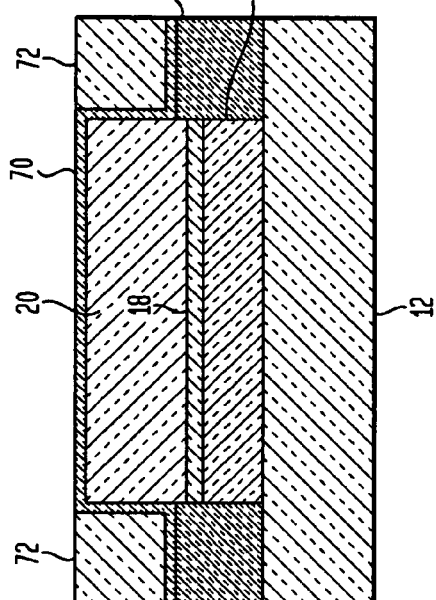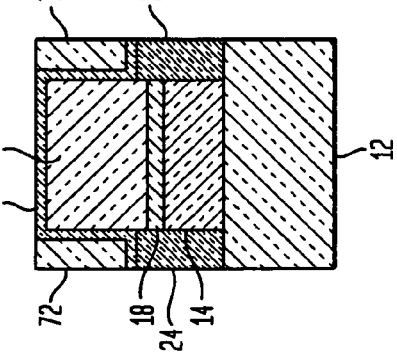

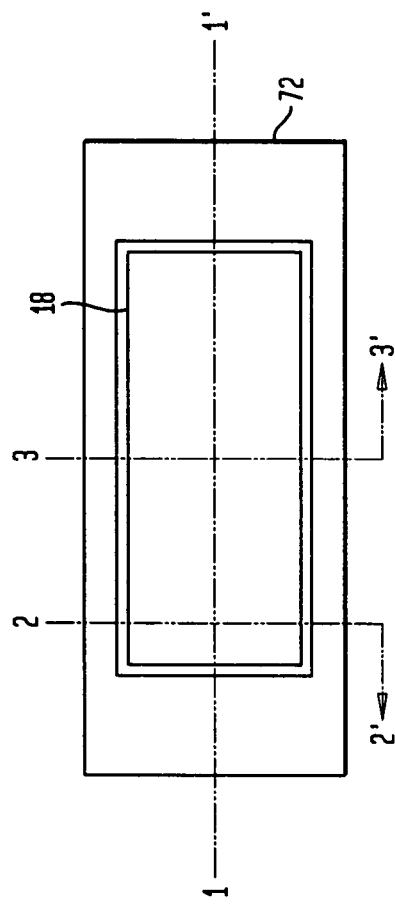
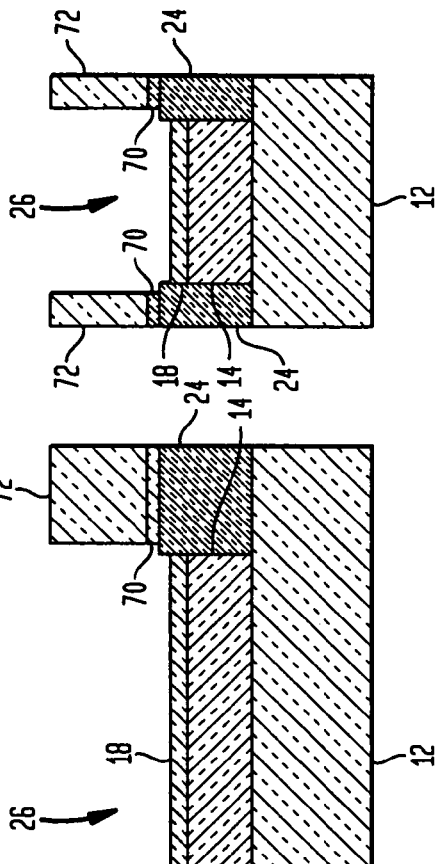
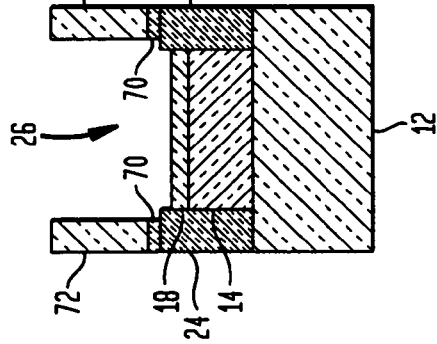

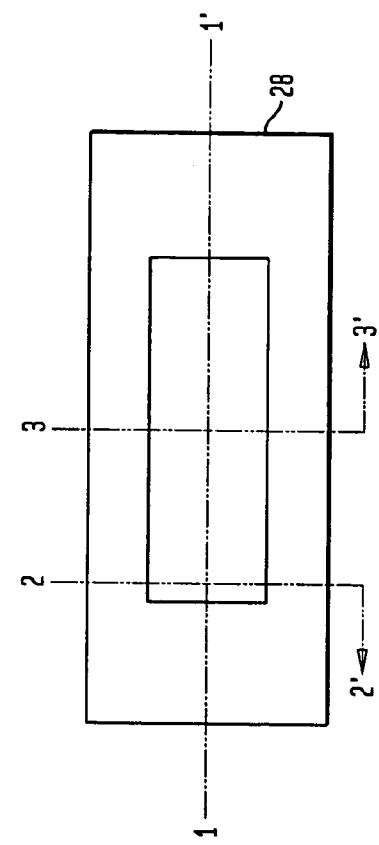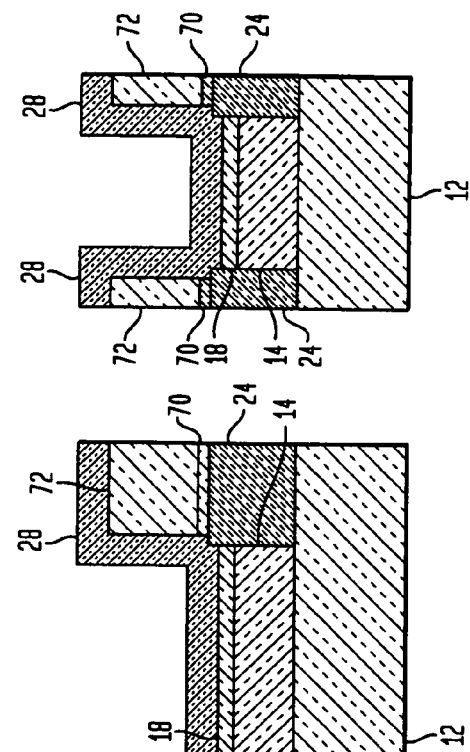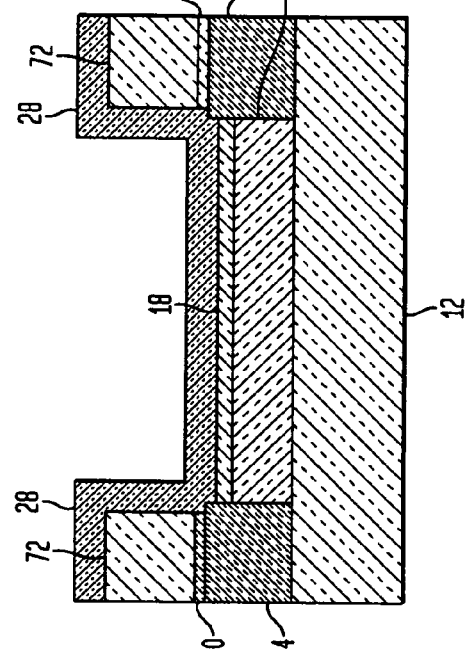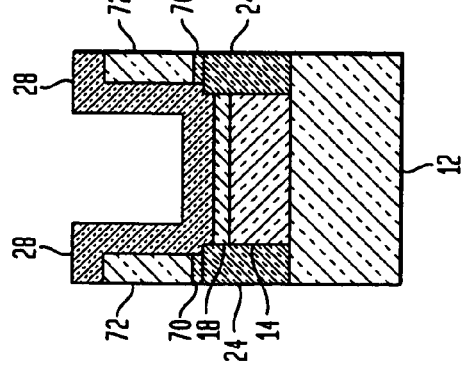

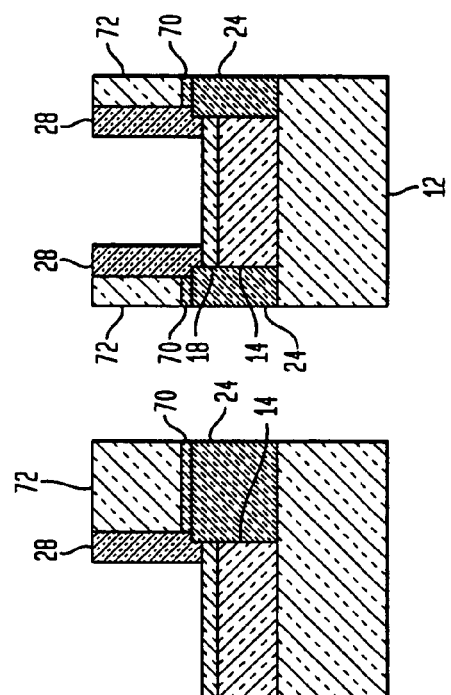
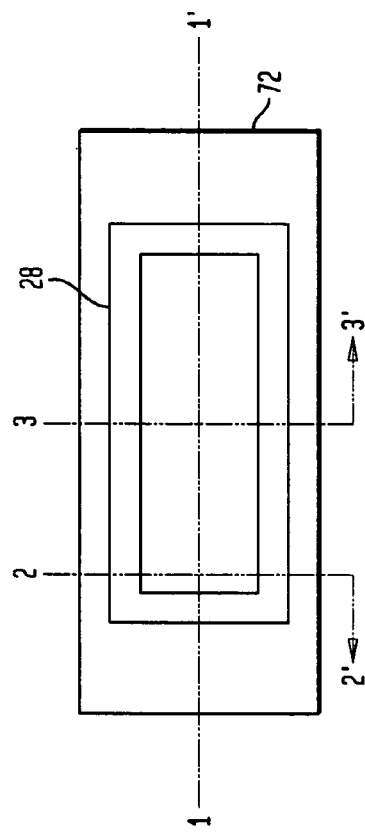
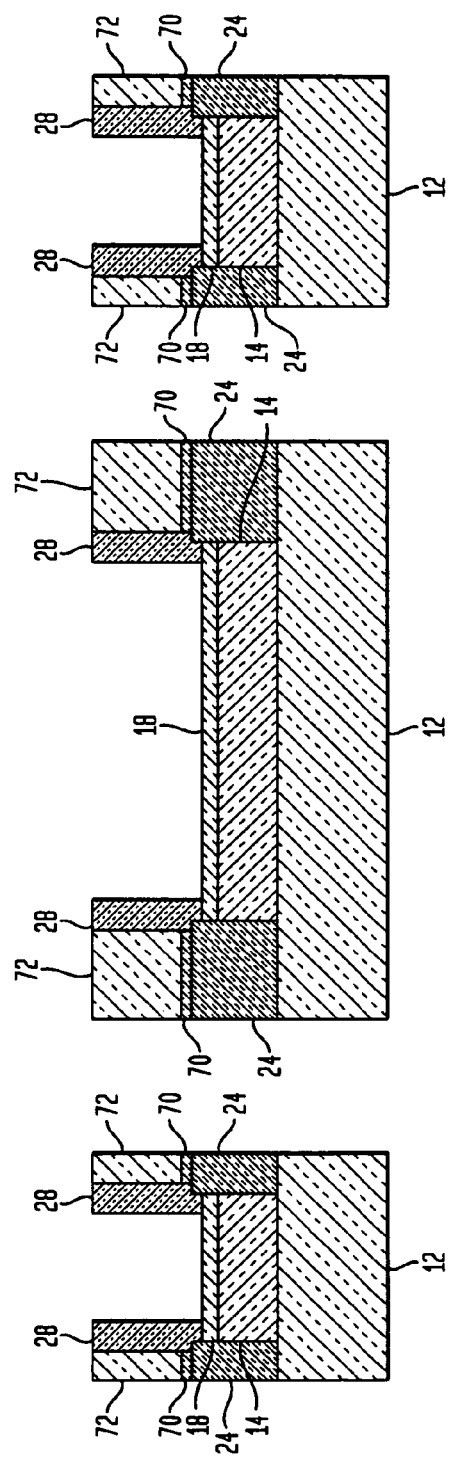
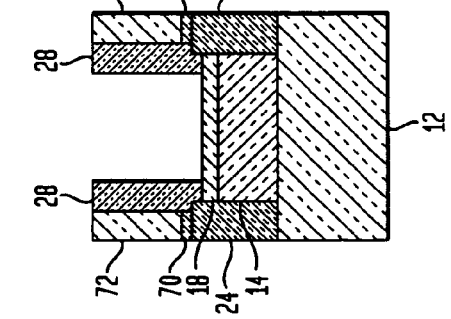

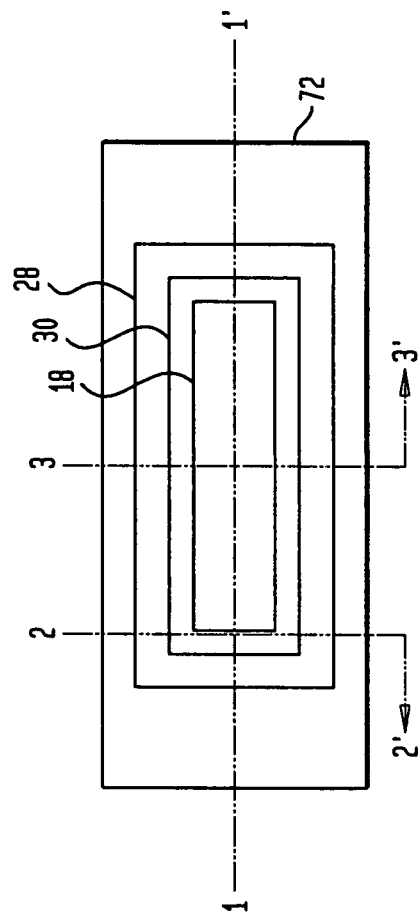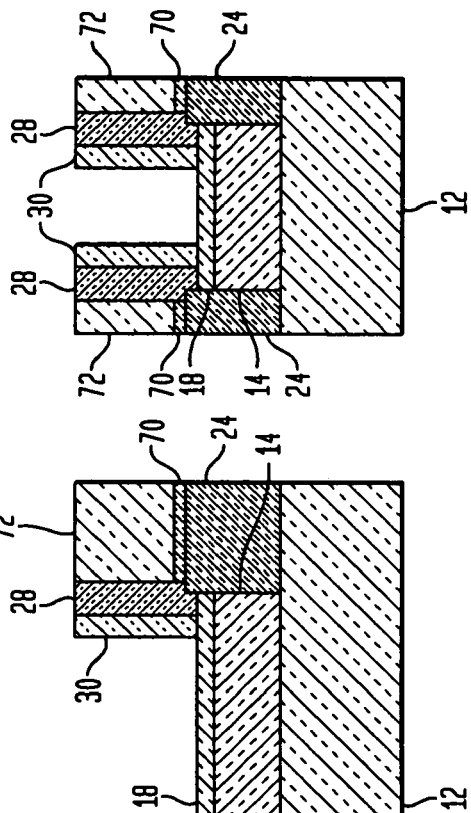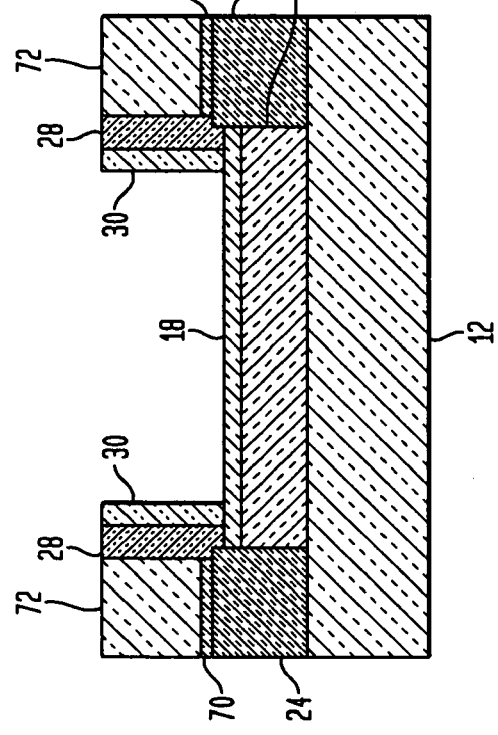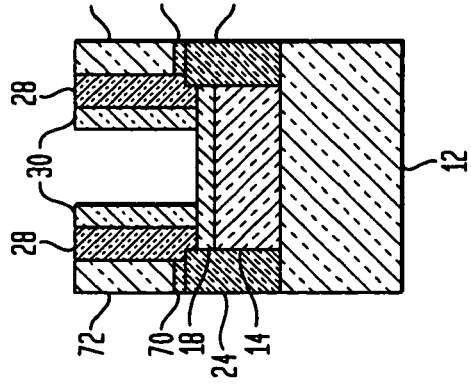

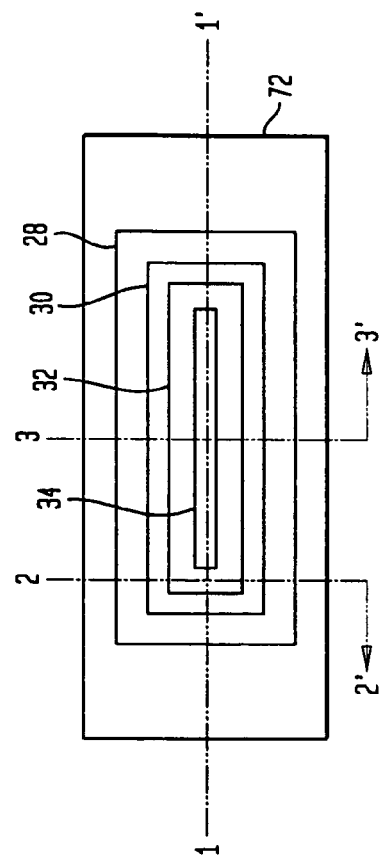
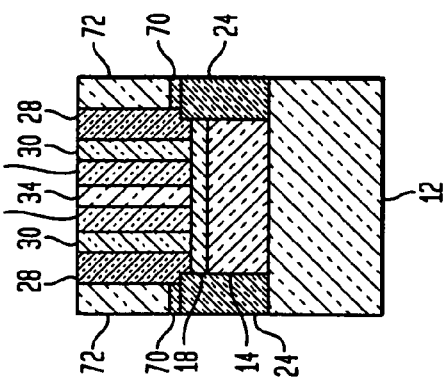
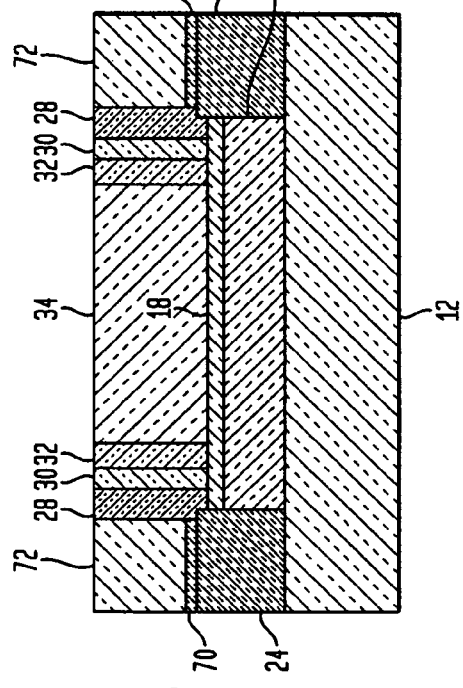
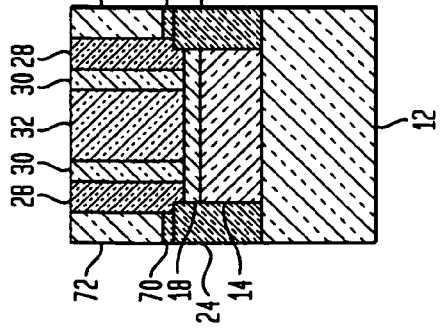

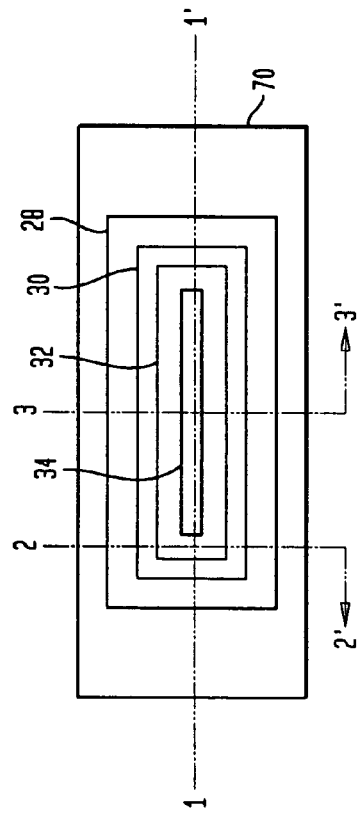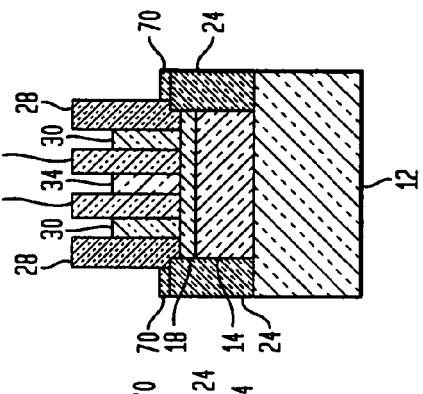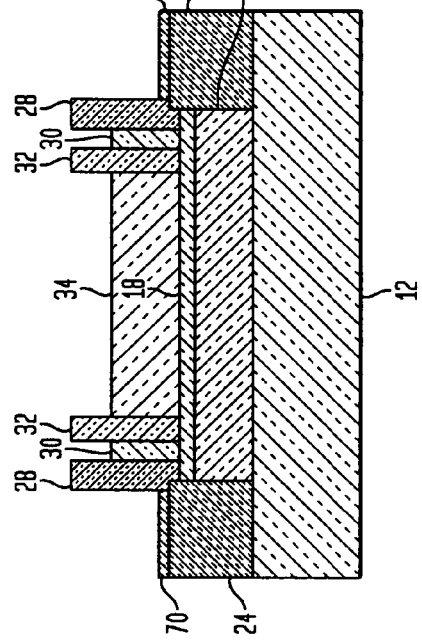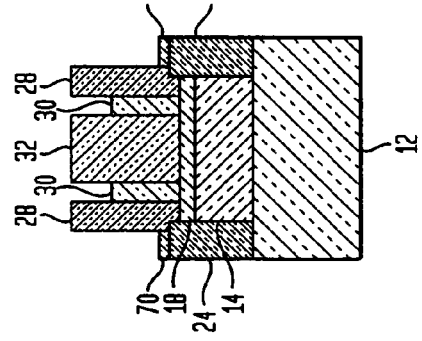

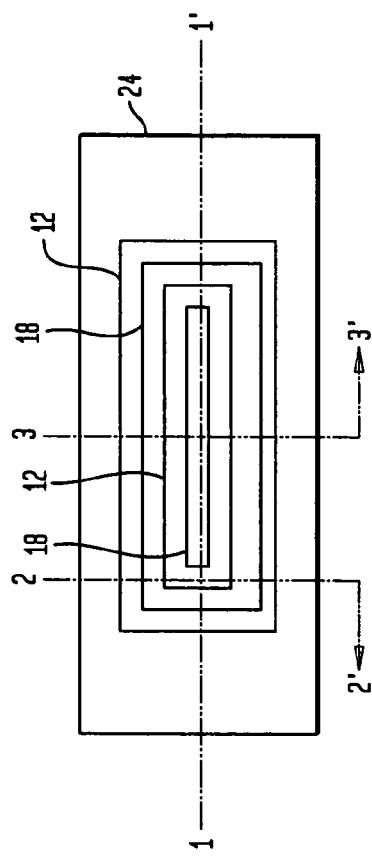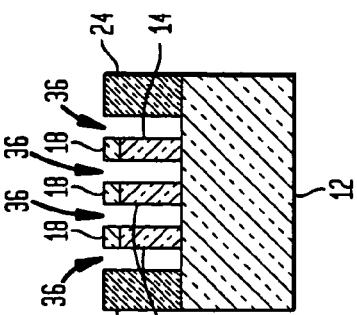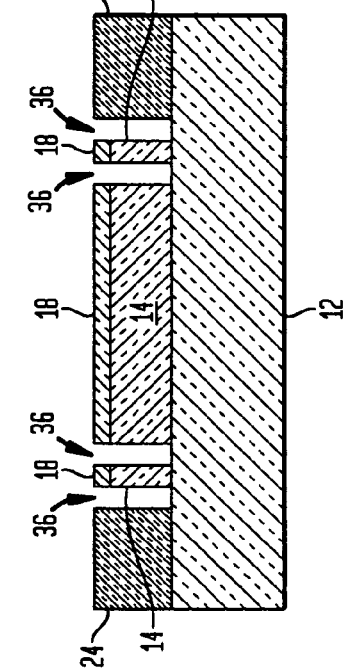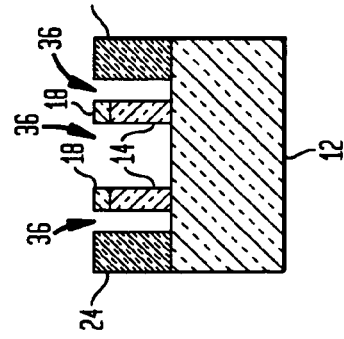

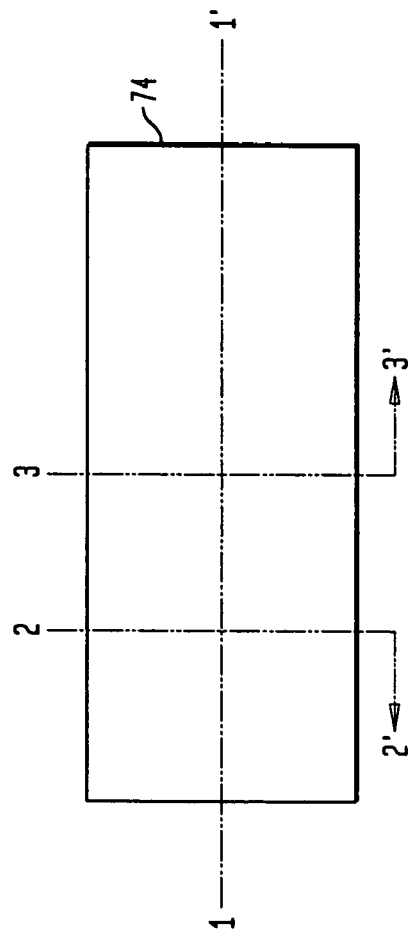
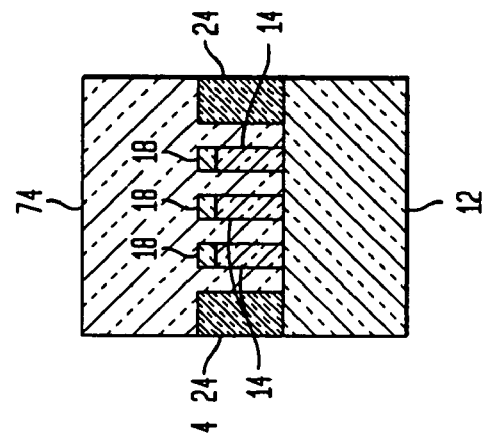
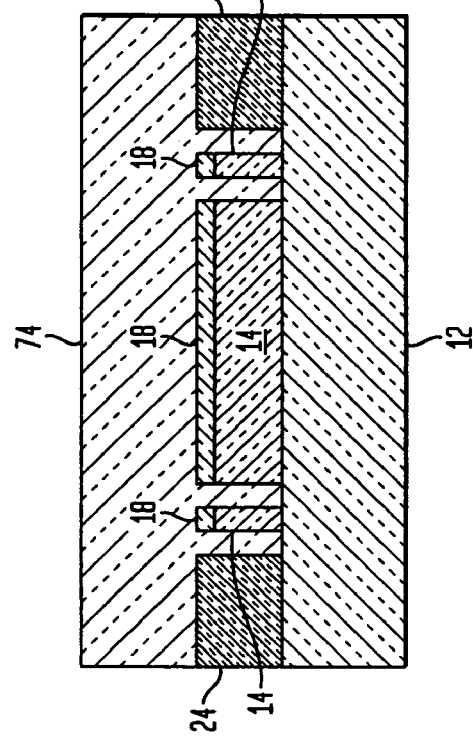
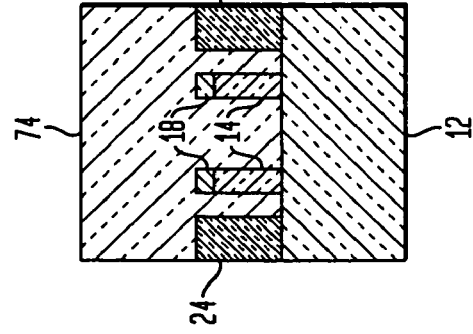

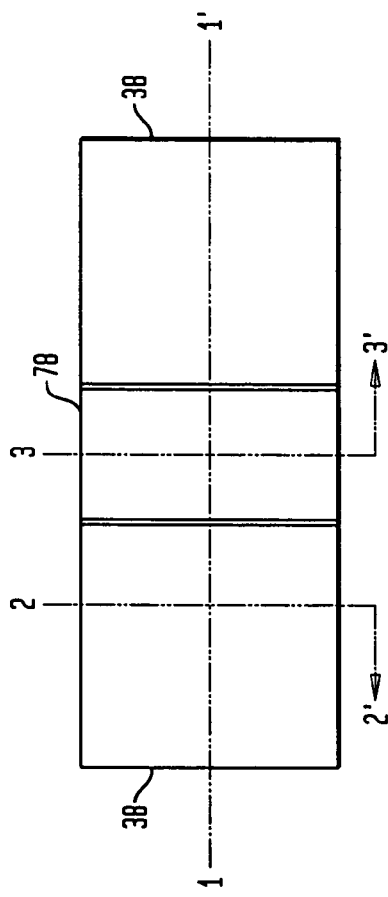
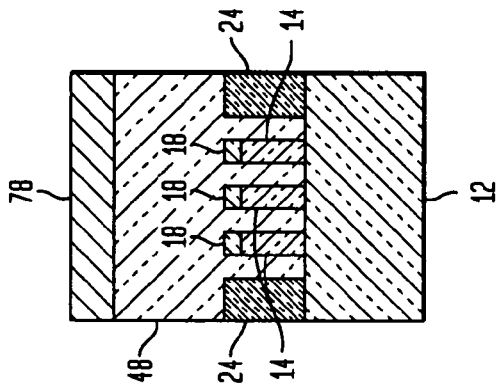
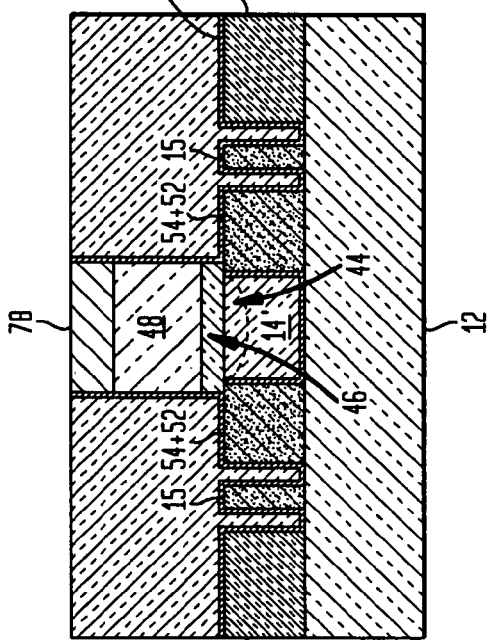
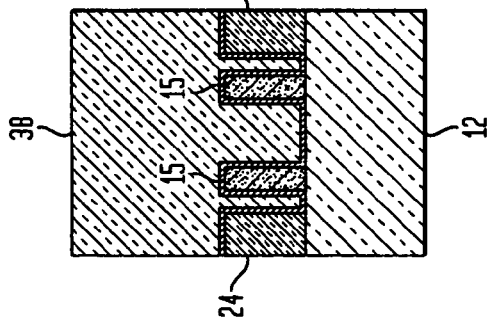

DAMASCENE GATE MULTI-MESA MOSFET

RELATED APPLICATIONS

This application is a divisional of U.S. patent application Ser. No. 10/262,190, filed Oct. 1, 2002 now U.S. Pat. No. 6,818,952.

This application is related to co-pending and co-assigned U.S. application Ser. No. 09/961,010, filed Sep. 21, 2001, the entire content of which is incorporated herein by reference.

FIELD OF THE INVENTION

The present invention relates to semiconductor device manufacturing, and more particularly to methods of fabricating multi-mesa metal oxide semiconductor field effect transistor (MOSFET) devices using damascene gate processing. The present invention is also directed to multi-mesa MOSFET structures that are formed by the inventive methods.

BACKGROUND OF THE INVENTION

In recent years, there has been an interest in increasing the integration density of integrated circuits (ICs). This interest is driven by the requisite for ICs having low-power dissipation, higher performance, increased circuit functionality and reduced fabrication cost. Power dissipation may be reduced by lower operation voltages that may require the geometry of the IC to be scaled down to achieve a desired performance. As geometries scale down, conductor length and parasitic capacitance decrease resulting in a decrease in signal propagation time. Furthermore, there are certain economic benefits of reduced processing cost resulting in the formation of a greater number of circuits on a single wafer or chip. However, as active devices are scaled to smaller dimensions, the device voltage must also be scaled down in order to provide a device that is reliable. Therefore, scalability of devices is constrained by the competing consideration of device performance and reliability.

In some circumstances, scaling of other types of devices to smaller sizes may have a deleterious effect on performance, particularly when the capacitance coupling effects are relied upon for device operability. FETs, which typically rely on alteration of conduction characteristics of a device channel in a semiconductor body by a capacitively coupled electrical field, when scaled to extremely small lateral dimensions, do not exhibit scalability of drive voltages, particularly in conduction threshold voltage (Vt). In fact, it is sometimes quite difficult to avoid increasing the Vt for a given off-current because the sub-threshold slope degrades with higher doping concentrations; higher doping concentration is typically required to reduce short channel effects because of the limits on the minimum thickness of the gate dielectric material. Additionally, reduced size limits the gate voltage (Vg) that can be applied to the device without breakdown and the lack of scalability in Vt reduces the available overdrive voltage (Vg–Vt) with a consequent reduction of available on-current of the device. Hence, existing bulk complementary metal oxide semiconductor (CMOS) technologies cannot be extended into very low operating voltages (on the order of less than 1.5 V).

To avoid the above-mentioned limitation with existing CMOS technologies, very-low temperature operation and silicon-on-insulator (SOI) structures have been proposed in an attempt to reduce Vt. However, the use of low operation temperatures in CMOS devices imposes server limitations on such devices including, for example, the possibility of using the same as a portable device, as well as the increased cost of operating such a CMOS device. Also, packaging reliability may arise with using low operation temperature CMOS devices. SOI devices, on the other hand, suffer from floating body effects and the cost of manufacturing the SOI structure itself.

In addition to the above proposals, a very narrow channel MOSFET structure has been developed in order to improve sub-threshold slope and high conduction current; See, for example, IBM Technical Bull. Vol. 34, No. 12, pp. 101–102 (May 1992) entitled "Corner Enhanced Field-Effect Transistor". In that prior art disclosure, corner conduction effects, which are generally considered to be parasitic at unavoidable edges of the channel, were exploited such that the corners dominate over the conduction in the remaining of the channel. This principal was extended, as described in the IBM Technical Bull. to a so-called multi-mesa structure by repeated conformal deposition and anisotropic etching of alternating layers of nitride and polysilicon which serve to fill the area between shallow trench isolation (STI) regions and form a plurality of narrow channels extending from the source to the drain of the transistor.

The fabrication of multi-mesa structures using the above processing steps of repeated deposition and etching is extremely expensive and, in some circumstances, compromises manufacturing yields. Further, corner dominated conduction implies high-levels of mesa doping to suppress conduction in other areas besides the corner regions. The prior art multi-mesa device also suffers from disproportionately high gate/input capacitance since significant portions of the area of the gate do not correspond to regions which significantly contribute to the conduction of the device.

Another approach to forming a similar multi-mesa device is disclosed, for example, in IBM Technology Bull. Vol. 34, No. 10A (March 1992), pp. 472–473. In this disclosure, slits are etched into a channel region formed in an SOI or bulk structure such that each slit essentially forms two back-to-back FETs, with the thickness of the channel layers defining the channel width. In this prior art method, the above problems with SOI structures are not obviated. Moreover, the slit and intervening channel size of the prior art structure is limited by minimum feature sizes obtainable with current lithography; limiting the minimum "footprint" in which the transistor can occupy.

U.S. Pat. No. 5,675,164 to Brunner, et al. provide a multi-mesa structure having sub-lithographic mesa widths and periodicity. The multi-mesa structure disclosed in Brunner, et al. is formed using a subtractive gate etching process which includes the steps of: exposing a pattern of lines on a photoresist, said pattern of lines having a pitch that is less than one-half micron; etching grooves of sub-lithographic width forming a grooved surface including mesa structures; forming an oxide on said grooved surface; and applying a gate electrode over the oxide.

One drawback of subtractive gate etching processes such as disclosed in the Brunner, et al. patent is that gate conductor stringers remain between the mesas. Furthermore, prior art subtractive gate etching processes do not permit channel doping in each mesa to be spaced away from the source/drain junctions edges, therefore, the prior art mesa structures have a relatively high drain electrical field associated therewith which serves to decrease the hot-carrier reliability and to increase the body charging effects of the device.

In addition to the above drawbacks with prior art methods of fabricating multi-mesa structures, prior art methods also have the following problems associated therewith: (i) The aspect ratio of the mesas (grooves) is limited because of the difficulty of delivering the same level of dopant using ion implantation throughout the depth of the source or drain, each of which is a single block of silicon and exposed only on the top for any doping method. (ii) The current drive distribution is highly non-uniform due to the non-uniform vertical source/drain doping profiles; and (iii) The use of a spacer for gate extension formation plugs up the mesas that need to be selectively etched out while protecting gate spacers.

Accordingly, there is a need for providing a new and improved method of fabricating multi-mesa FET structures that have improved electrical characteristics such as an improved sub-threshold slope, negligible back bias sensitivity, a high immunity to drain induced barrier lowering (DIBL), and a high current drive.

SUMMARY OF THE INVENTION

One object of the present invention is to provide a multi-mesa FET structure that has doping on the sidewalls of the mesa in the source and drain area.

Another object of the present invention is to provide a multi-mesa FET structure that provides a uniform level of source and drain doping across the entire width of current conduction, and thus, the inventive structure has a well-defined threshold voltage and good sub-threshold slope characteristics associated therewith.

Yet another object of the present invention is to provide a multi-mesa FET structure that enables a much higher level of current density per unit silicon area by enabling tall mesas, without limitation to the uniformity of doping across the source and the drain.

Still another object of the present invention is to provide methods of fabricating a multi-mesa FET structure using processing steps that eliminate gate conductor stringers between adjacent mesas.

An even further object of the present invention is to provide methods of fabricating a multi-mesa FET structure which allow for the independent doping of the gate conductor and the source/drain diffusion regions.

A yet other object of the present invention is to provide methods of fabricating a multi-mesa FET structure which exhibit improved electrical properties such as a sub-threshold slope that does not degrade, negligible back bias sensitivity, a high immunity to DIBL, and a high current drive.

Other objects of the present invention include: (i) methods of fabricating a multi-mesa FET structure that permit the use of high-k gate dielectrics and metallic gate conductors. The term "high-k dielectrics" denotes a dielectric material having a dielectric constant of about 10 or greater; and (2) methods of fabricating a multi-mesa FET in which the channel doping in each mesa is spaced away from the source/drain junction edges thereby reducing the drain electrical field, improving hot-carrier reliability and reducing body charging effects.

These and other objects and advantages are obtained in the present invention by providing methods that employ either a damascene gate process or alternatively a damascene replacement gate process instead of conventional subtractive etching methods. Both methods of the present invention are capable of forming a multi-mesa FET that has source and drain regions formed in sidewall portions of each mesa. In some highly preferred embodiments of the present invention, uniform doping of the sidewall portions of each mesa region created is achieved by gas phase doping or plasma doping.

In accordance with one aspect of the present invention, a multi-mesa FET structure is provided that comprises:

a plurality of Si-containing mesa regions, each mesa region having sidewall surfaces that are doped so as to form source and drain regions;

a channel region in each of said mesa regions, said channel region electrically contacting said source and drain regions;

a gate dielectric located atop said channel region on a surface of each of said mesa regions; and a gate conductor atop said gate dielectric.

The mesa regions of the present invention may be configured to form either nested mesa regions or mesa regions that are parallel to one another.

The Si-containing mesa region may be comprised of Si, SiGe, SiC, SiGeC, Si/Si, Si/SiC, Si/SiGeC or a Si-containing layer of a silicon-on-insulator (SOI) wafer. That is, the mesas may be formed of bulk Si, a Si alloy such as SiGe, SiGe, SiC, and SiGeC, bulk Si having either a Si or Si alloy formed thereon, or a SOI wafer.

The damascene gate embodiment of the present invention comprises the steps of:

providing a planar structure comprising a pad stack located atop a Si-containing layer;

removing portions of the pad stack to define at least one device aperture in said structure;

forming at least one mesa region comprising a portion of said Si-containing layer in said at least one device aperture, said at least one mesa region having sidewall portions;

forming a dielectric material having an opening that exposes a portion of said at least one mesa region;

forming a first gate region including a channel region, gate dielectric and gate conductor in said opening, said channel region being formed into said at least one mesa region, while said gate dielectric and gate dielectric being formed on said at least one mesa region;

removing said dielectric material about said gate region and forming spacers on exposed vertical sidewalls of said gate conductor; and forming source and drain regions in said sidewall portions of said at least one mesa region.

The first embodiment of the present invention may also be used to form a plurality of mesa regions in a plurality of device apertures. When a plurality of mesa regions are formed, the method of the first embodiment of the present invention can form a predetermined number of first gate regions, each first gate region having the same polarity (i.e., NFET or PFET), on a predetermined number of mesa regions, and thereafter second gate regions having opposite polarity of the first gate regions (i.e., NFET or PFET) can be formed in other mesa regions.

In the second embodiment of the present invention, i.e., the damascene gate replacement embodiment, the inventive method includes the steps of:

providing a planar structure comprising a patterned pad stack located atop a surface of Si-containing layer, said patterned pad stack surrounded by shallow trench isolation regions which extend into said Si-containing layer;

lining said structure including said patterned pad stack with a nitride layer;

providing an oxide layer that is coplanar with a surface of said nitride layer that is located atop an upper surface of said patterned pad stack and removing said nitride layer and a portion of said patterned pad stack to form at least one device aperture;

forming at least one mesa region in said at least one device aperture, said at least one mesa region including sidewall portions;

forming a mesa fill material on a portion of said at least one mesa region;

forming source and drain regions in said sidewall portions of said at least one mesa region;

removing the mesa fill material to expose a portion of said at least one mesa region; and forming a first gate region including a channel region, gate dielectric and gate conductor on said exposed portion of said at least one mesa region, said channel region being formed into said at least one mesa region, while said gate dielectric and gate dielectric being formed on said at least one mesa region.

The term "mesa fill material" is used herein to denote a material that can reasonably fill spaces which are formed between each mesa region. Examples of suitable materials include amorphous Si or polysilicon.

The second embodiment of the present invention may also be used to form a plurality of mesa regions in a plurality of device apertures. When a plurality of mesa regions are formed, the method of the second embodiment of the present invention can form a predetermined number of first gate regions, each first gate region having the same polarity (i.e., NFET or PFET), on a predetermined number of mesa regions, and thereafter second gate regions having opposite polarity of the first gate regions (i.e., NFET or PFET) can be formed in other mesa regions.

BRIEF DESCRIPTION OF THE DRAWINGS

FIGS. 1–23 are pictorial representations illustrating the basic processing steps employed in the first embodiment of the present invention, i.e., in the damascene gate embodiment.

FIGS. 25–42 are pictorial representations illustrating the basic processing steps employed in the second embodiment of the present invention, i.e., in the damascene gate replacement embodiment.

Figure 3A:
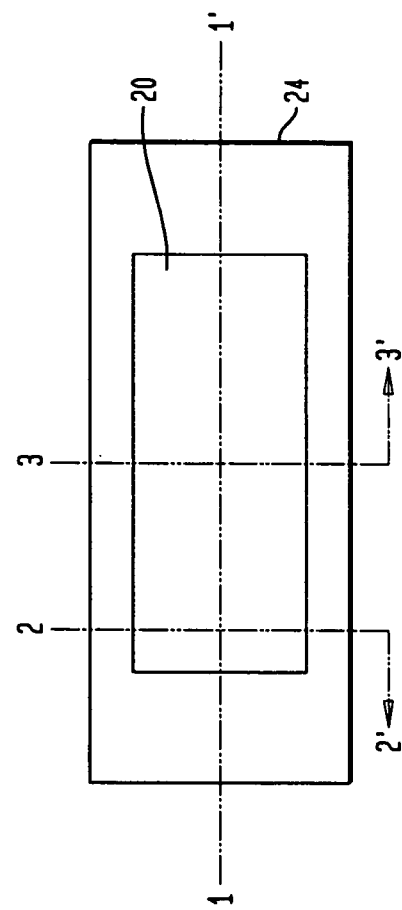
Figure 3D:
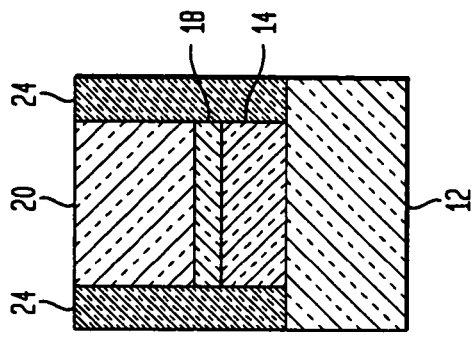
Figure 3C:
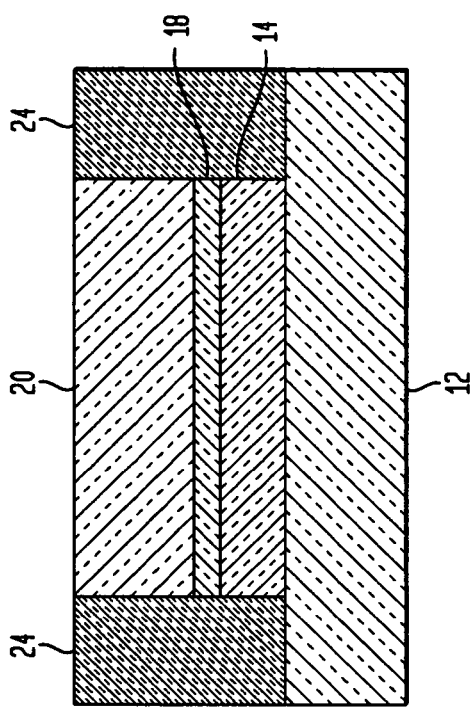
Figure 3B:
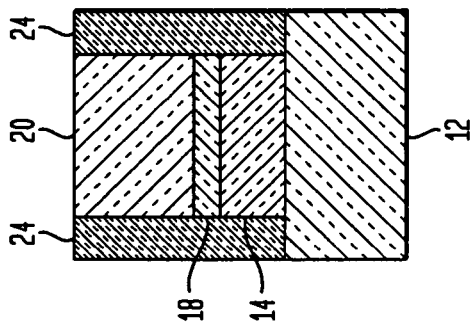
Figure 4D:
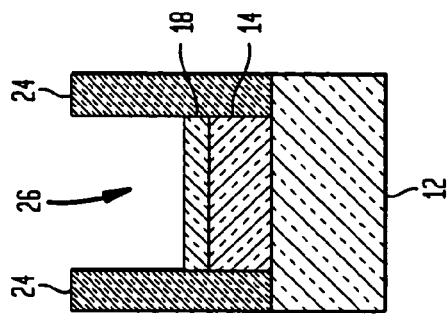
Figure 4A:
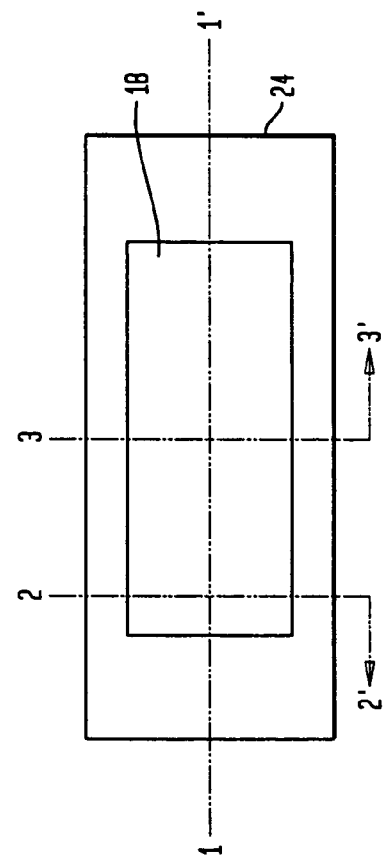
Figure 4C:
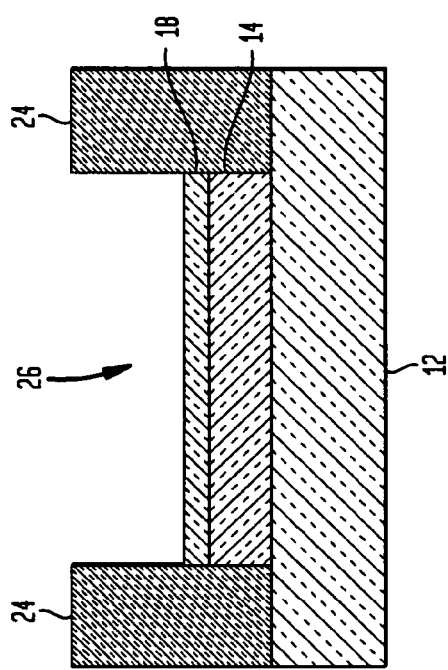
Figure 4B:
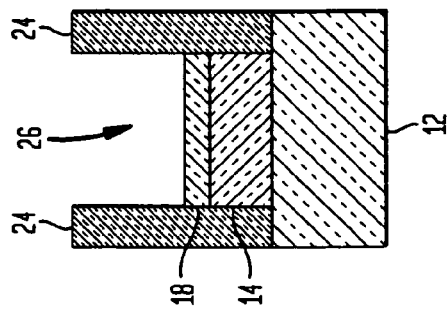
Figure 5A:
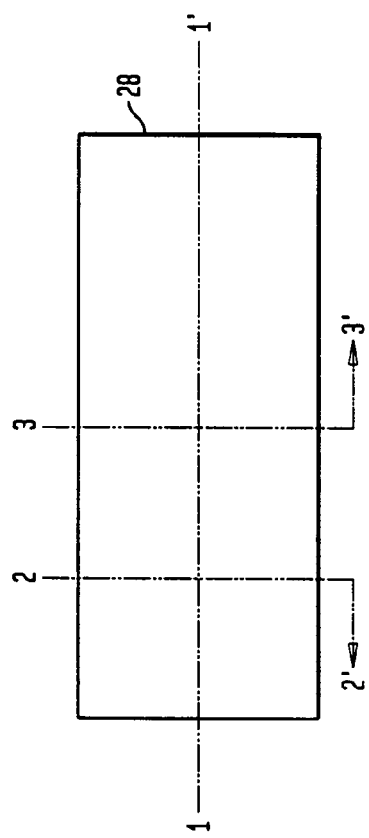
Figure 5D:
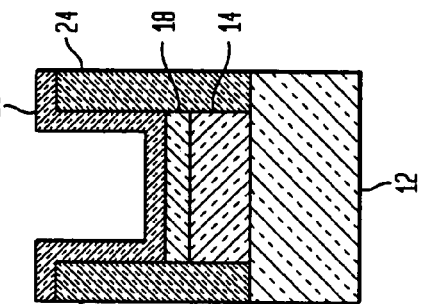
Figure 5C:
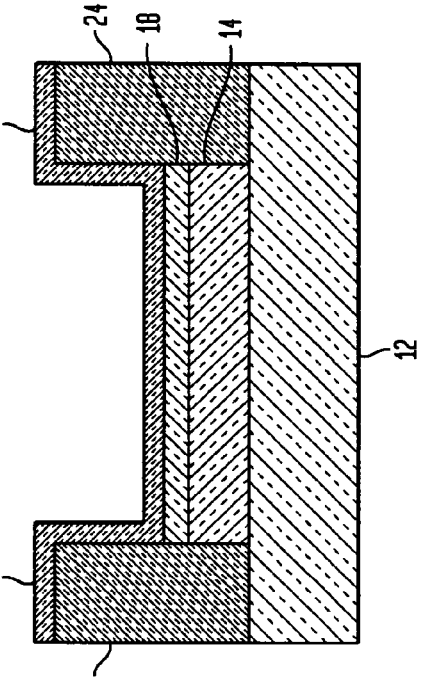
Figure 5B:
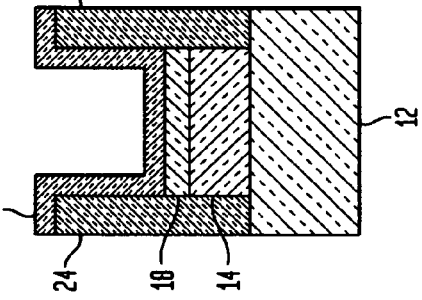
Figure 7A:
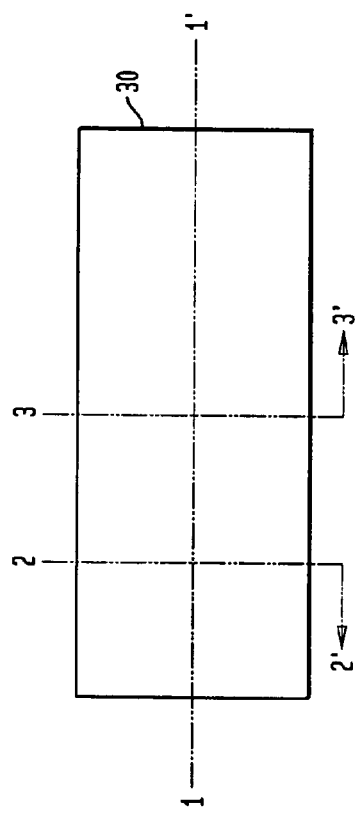
Figure 7B:
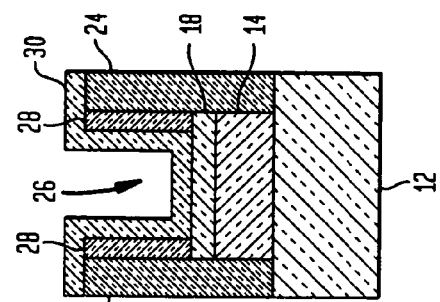
Figure 7C:
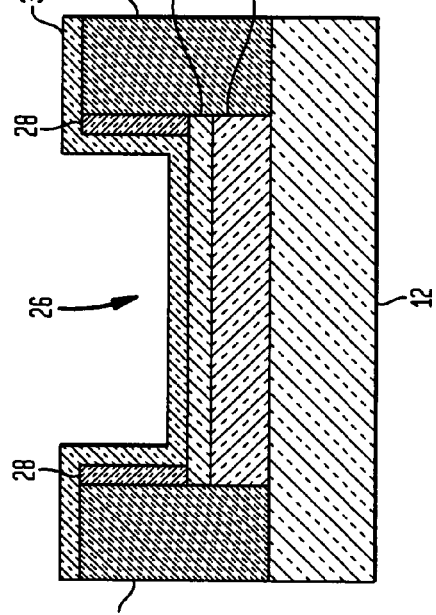
Figure 7D:
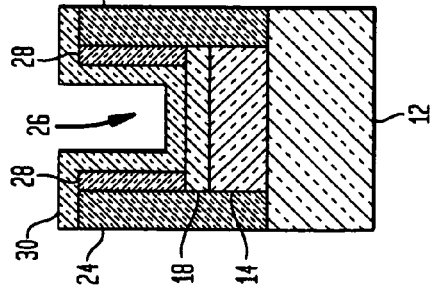

Note that each of FIGS. 1–42 includes the following views:

A=a top view having lines 1–1', 2–2' and 3–3';
B=a cross-sectional view dissected along line 2–2' shown in A;
C=a cross-sectional view dissected along line 1–1' shown in A;
D=a cross-sectional view dissected along line 3–3' shown in A.

DETAILED DESCRIPTION OF THE INVENTION

The present invention, which provides various methods for preparing a multi-mesa FET structure having source and drain regions formed into sidewall portions of each mesa, will now be described in greater detail by referring to the drawings that accompany the present application.

The present invention provides two novel damascene gate process embodiments for forming multi-mesa FET structures and the structures thus obtained. The first embodiment illustrated in FIGS. 1–24 (including views A–D) features a damascene gate process which allows independent doping of the gate conductor and the source/drain regions. The gate conductor may be doped extremely high without the danger of producing high doping concentration in the source/drain regions because of the presence of a protective oxide fill.

Additionally, the source/drain regions may be doped by one, or a combination, of gas phase doping (GPD), plasma doping, and angled ion implantation. It should be noted that geometry-independent doping methods, such as gas phase doping and plasma doping will produce superior devices. However, this invention can be implemented, without imparting from the spirit of the present invention, with conventional angled implants, if the aspect ratio of the space between adjacent mesas is kept low, that is, when the mesas are not tall and the spaces between them are wide. It should be recognized that devices thus fabricated will tend to have inferior performance than those that utilizes geometry-independent doping methods.

The channel doping is performed following the opening of the gate region in the mandrel. In some embodiments of the present invention to be discussed in more detail below, sidewall spacers are formed in the opening prior to channel doping. The sidewall spacers serve to space the channel doping from the source/drain diffusion regions, centralizing the channel doping distribution.

FIG. 1A–D illustrates an initial structure that is employed in the first embodiment of the present invention. Although all illustrations are done on an SOI substrate, it should be clear that implementation on a conventional bulk substrate requires virtually no modification and is straightforward. Thus, in the drawings of the present invention SOI wafer 10 may be replaced with any other type of Si-containing substrate having an upper layer that is comprised of a Si-containing material. Illustrative examples of other types of Si-containing substrates include: Si, SiGe, SiC, SiGeC, Si/Si, Si/SiC, and Si/SiGeC. Note that each of these substrates contains an upper Si-containing material layer, e.g., bulk Si, a Si alloy, or SOI.

Specifically, the initial structure shown in FIG. 1A–D comprises silicon-on-insulator (SOI) wafer 10 which has pad stack 16 located atop a surface thereof. The SOI wafer includes a bottom Si-containing substrate (not specifically shown or labeled), buried insulating region 12 located atop the bottom Si-containing substrate, and Si-containing layer 14, i.e., the SOI layer in which active devices can be formed therein or thereon. The buried insulating region, which may be an oxide or a nitride, electrically isolates the Si-containing substrate from the Si-containing layer. The term "Si-containing" as used throughout the present application denotes a material that includes at least silicon. Illustrative examples of such Si-containing materials include, but are not limited to: Si, SiGe, SiC, SiGeC, Si/Si, Si/SiC, and Si/SiGeC. Buried insulating region 12 may be a continuous buried insulating region, as is shown in FIG. 1, or it may be a non-continuous, i.e., patterned, buried insulating region (not shown). The non-continuous buried insulating regions are discrete and isolated regions or islands that are surrounded by Si-containing layers.

The SOI wafer may be formed utilizing conventional SIMOX (separation by ion implantation of oxygen) processes well-known to those skilled in the art, as well as the various SIMOX processes mentioned in co-assigned U.S. patent application Ser. Nos. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Alternatively, the SOI wafer may be made using other conventional processes including, for example, a thermal bonding and cutting process.

In addition to the above techniques, the initial SOI wafer employed in the present invention may be formed by deposition processes as well as lithography and etching (employed when fabricating a patterned substrate). Specifically, the initial SOI wafer may be formed by depositing an insulating oxide or nitride film atop a surface of a Si-containing substrate, via a conventional deposition or thermal growing process; optionally patterning the insulating film by employing conventional lithography and etching; and thereafter forming a Si-containing layer atop the insulating film using a conventional deposition process including, for example, chemical vapor deposition (CVD), plasma-assisted CVD, sputtering, evaporation, chemical solution deposition or epitaxial Si growth.

The thickness of the various layers of the initial SOI wafer may vary depending on the process used in making the same. Typically, however, Si-containing layer 14 has a thickness of from about 100 to about 200 nm. In the case of buried insulating layer 12, that layer may have a thickness of from about 100 to about 400 nm. The thickness of the Si-containing substrate is inconsequential to the present invention. It is noted that the thicknesses provided above are exemplary and by no ways limit the scope of the present invention.

Pad stack 16 is then formed atop the surface of Si-containing layer 14 using processes well-known to those skilled in the art. As shown, in FIGS. 1A–D, pad stack 16 comprises pad oxide layer 18 and hardmask 20, respectively. In accordance with the present invention, the pad oxide layer of pad stack 16 is first formed atop a surface of Si-containing layer 14 utilizing a conventional thermal growing process. Alternatively, pad oxide layer 18 may be formed by a conventional deposition process including, but not limited to: chemical vapor deposition (CVD), plasma-assisted CVD, chemical solution deposition, sputtering and evaporation. The thickness of the pad oxide layer may vary depending on the technique used in fabricating the same. Typically, however, pad oxide layer 18 has a thickness of from about 5 to about 15 nm.

Hardmask 20 is then formed atop pad oxide layer 18 utilizing a conventional deposition process such as CVD, plasma-assisted CVD, sputtering, chemical solution deposition, and evaporation. The hardmask is composed of SiN, SiON or other like materials that are capable of functioning as a hardmask as well as a polish stop layer. The thickness of hardmask 20 is not critical to the present invention, but typically hardmask 20 has a thickness of from about 50 to about 100 nm.

Next, and as shown in FIGS. 2A–D, trenches 22, which will be subsequently used in forming shallow trench isolation regions, are formed into the structure shown in FIG. 1. The trenches which are formed through hardmask 20, pad oxide 18 and Si-containing layer 14, stopping on buried insulating region 12, are formed utilizing conventional lithography and etching.

The lithography step employed in forming the trenches comprises the steps of: applying a photoresist (not shown) to the upper horizontal surface of hardmask 20, exposing the photoresist to a pattern of radiation, and developing the pattern into the exposed photoresist utilizing a conventional resist developer.

The etching step, which may be conducted in a single step or multiple etching steps, includes the use of a dry etching process such as reactive-ion etching (RIE), plasma etching or ion beam etching. The etching step forms trenches 22 into the structure which will be subsequently filled with an insulating material. Note that vertical sidewalls of Si-containing layer 14, pad oxide 18 and hardmask 20 are bare after etching. The photoresist is typically removed from the structure after the patterned has been transferred into hardmask 20 utilizing a conventional resist stripping process.

After defining the trenches, the structure shown in FIGS. 2A–D is subjected to an optional oxidation process which can be used to form a thin liner (not separately shown or labeled) on the bare sidewalls as well as the bottom wall of the trench. Next, the trenches (with or without the optional liner) are filled with a dielectric material such as TEOS (tetraethylorthosilicate) utilizing a conventional deposition process such as CVD or plasma-assisted CVD and thereafter the structure is planarized utilizing a conventional planarization process such as chemical-mechanical polishing (CMP) or grinding, stopping on the upper surface of hardmask 20. An optional densification step may be performed after filling the trench, but prior to planarization. The resultant structure, which now includes STI (shallow trench isolation) regions 24, is shown, for example, in FIGS. 3A–D.

Next, and as shown in FIGS. 4A–D, the remaining portions of hardmask 20 not removed during trench formation are now removed utilizing a wet etching process that is highly selective for removing nitride or oxynitride as compared with oxide or dielectric material. Specifically, the wet etching employed at this point of the present invention for removing the hardmask comprises, for example, the use of hot phosphoric acid in a wet etch tank or any other equivalent tool.

As shown in FIGS. 4A–4D, the removal of hardmask 20 from the structures provides a device aperture 26 in the structure which stops atop or in a surface portion of pad oxide layer 18. It should be noted that although the drawings illustrate the formation of a single device aperture, the present invention contemplates the formation of a plurality of such device apertures in the structure. Because one or more device apertures can be formed, the present application uses the term "at least one device aperture" hereinbelow. The at least one device aperture defines the area where the base of the FET will be formed. This base will be raised therefore the term mesa is used herein. Moreover, each mesa region of the present invention will have sidewall portions and each mesa region will be separated from other mesa regions by spaces.

In the present invention, repeated use of deposition and reactive ion etching of two different materials is used to create a nested pattern inside said at least one device aperture. In accordance with the present invention, one of the two different materials is resistant to an etch chemistry and other material is easily etched by the etch chemistry, It should be noted, however, that the rest of the invention is compatible with any other method of forming a mesa pattern on the top surface.

Also, in the present invention, one method of transferring the pattern of said two materials within said at least one device aperture is described. However, the rest of the invention is compatible with any other method of transferring the pattern of said two materials onto the Si-containing material layer.

One preferred method employed in the present invention for the formation and transfer of the mesa pattern is as follows: after defining the at least one device aperture, nitride layer 28 is conformally formed on the exposed horizontal and vertical surfaces of the structure shown in FIGS. 4A–D so as to provide the structure shown in FIGS. 5A–D. Specifically, nitride layer 28 is formed utilizing a conventional deposition process including, for example, low-pressure CVD. When this embodiment is employed in the present invention for mesa patterning, the thickness of nitride layer 28 defines the space between each adjacent mesa region. Depending on the exact method of pattern transfer into the silicon below, the nitride layer could be used in defining the width of each mesa instead. Typically nitride layer 28 has a thickness of from about 10 to about 100 nm.

Following the deposition of nitride layer 28, the horizontal surface portions of nitride layer 28 are removed utilizing a reactive-ion etching (RIE) process that is highly selective in removing nitride so as to provide the structure shown in FIGS. 6A–6D. Note that in these drawings, vertical portions of nitride layer 28 remaining on the vertical sidewalls of STI regions 24.

A conformal layer of amorphous-Si (a:Si) 30 is then formed on all exposed horizontal and vertical surfaces of the structure shown in FIGS. 6A–D so as to provide the structure shown in FIGS. 7A–D. The a:Si is formed utilizing a conventional deposition process including, for example, CVD or plasma-assisted CVD. The thickness of a:Si layer 30 defines the width of a mesa to be formed below. Depending on the exact method of pattern transfer into the silicon below, this layer could define the spacing between adjacent mesas instead. Typically a:Si layer 30 has a thickness of from about 10 to about 100 nm.

The choice of thicknesses for the mesa and the spacing between them depends on the process capability and the desired device structure. In general, narrow mesa devices will tend to operate in the fully depleted regime imitating the performance of conventional SOI devices. The number and the height of the mesas will be, however, the deciding factor in determining the full on-current.

Following deposition of a:Si layer 30, the a:Si which lays atop the horizontal surfaces of the structure is removed utilizing an RIE process that is highly selective in removing a:Si so as to provide the structure shown in FIGS. 8A–8D. Note that in these drawing a:Si remains on the vertical sidewalls walls of etched nitride layer 28.

FIGS. 9A–9D illustrate the structure that is formed after repeating the steps of nitride deposition and etching and a:Si deposition and etching. In FIGS. 9A–9D, reference numeral 32 denotes nitride and reference numeral 34 denotes a:Si. As shown, the at least one device aperture is filled with alternating layers of nitride and a:Si.

Figure 10A:
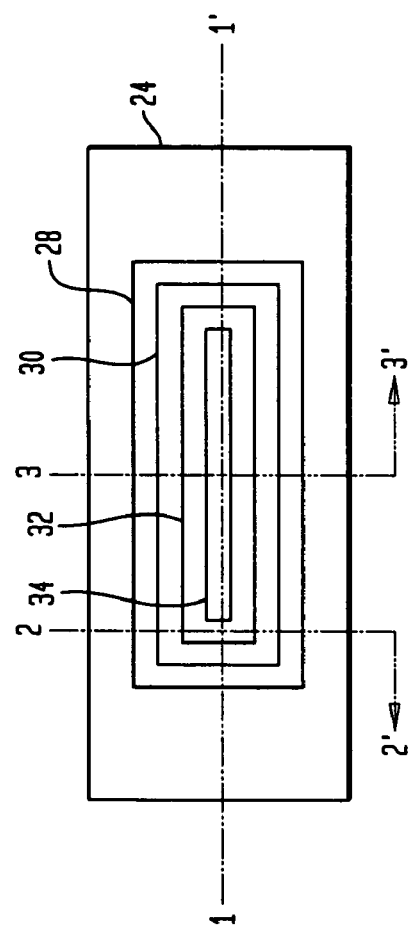
Figure 10D:
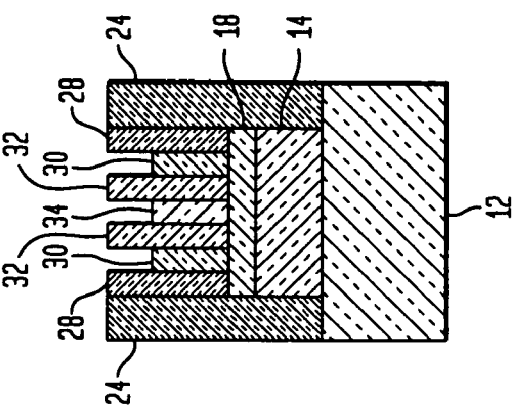
Figure 10C:
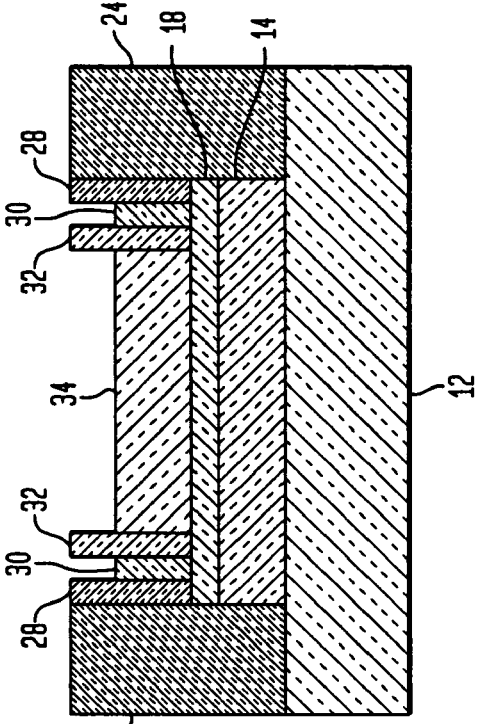
Figure 10B:
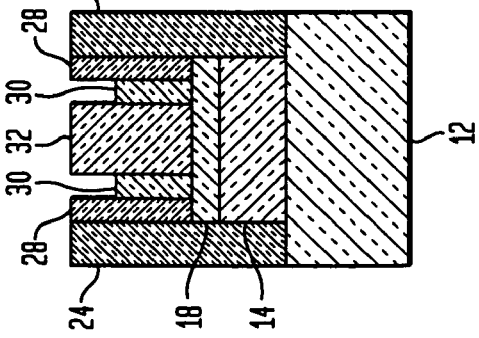
Figure 11A:
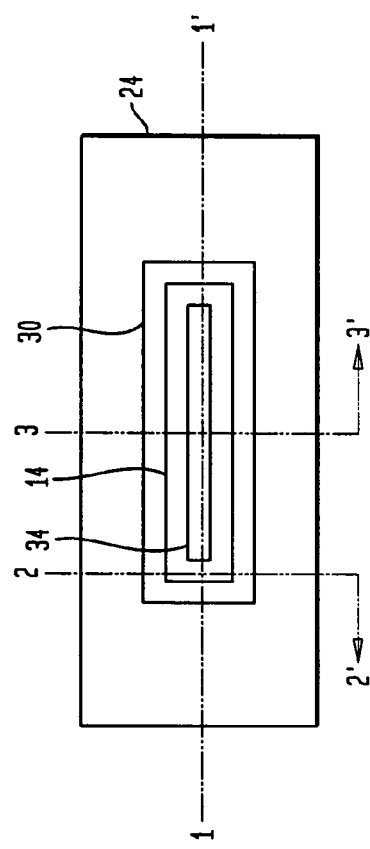
Figure 11D:
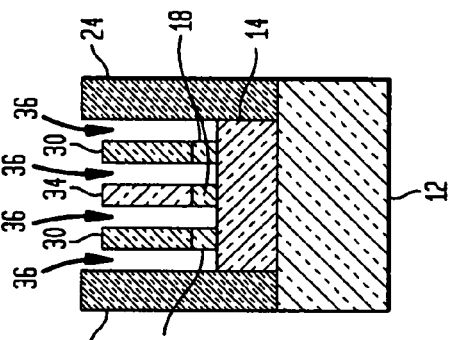
Figure 11C:
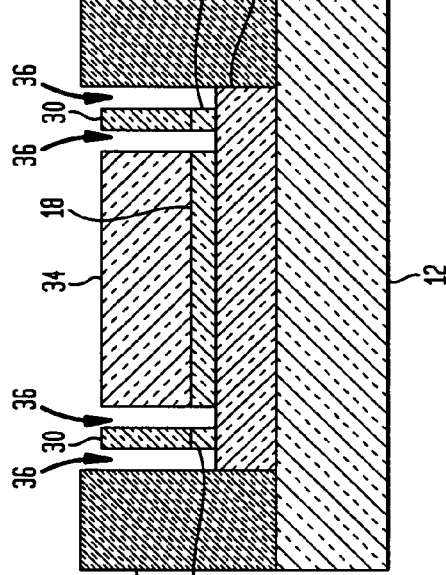
Figure 11B:
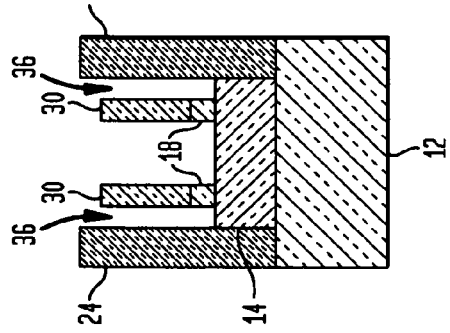
Figure 18D:
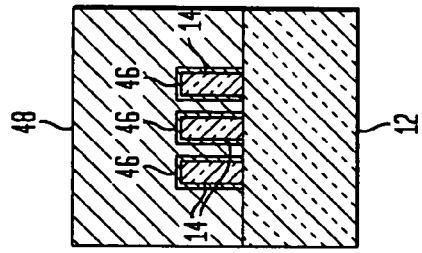
Figure 18A:
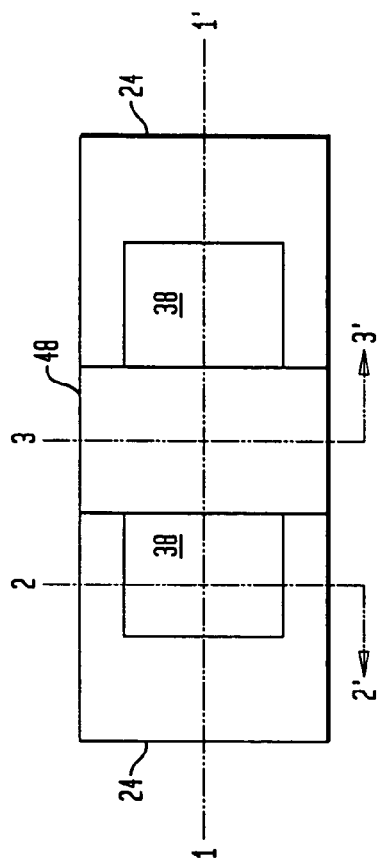
Figure 18C:
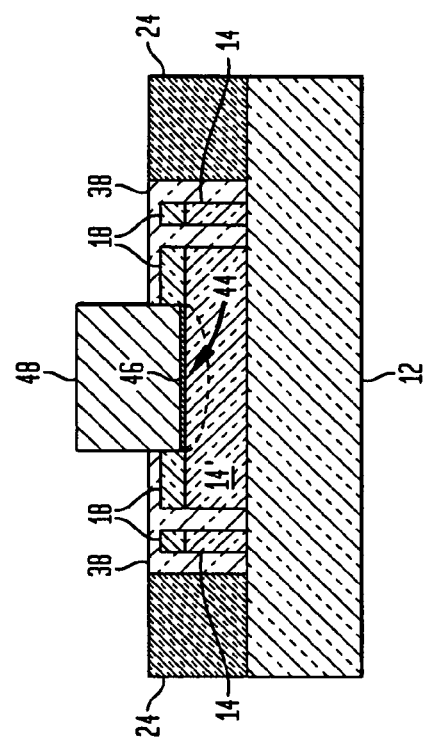
Figure 18B:
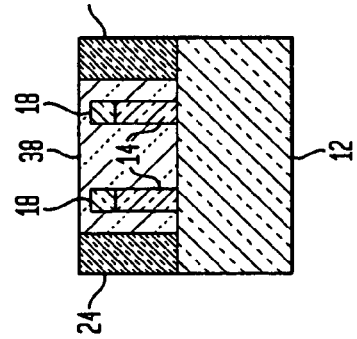
Figure 20D:
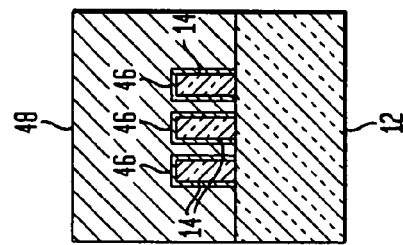
Figure 20A:
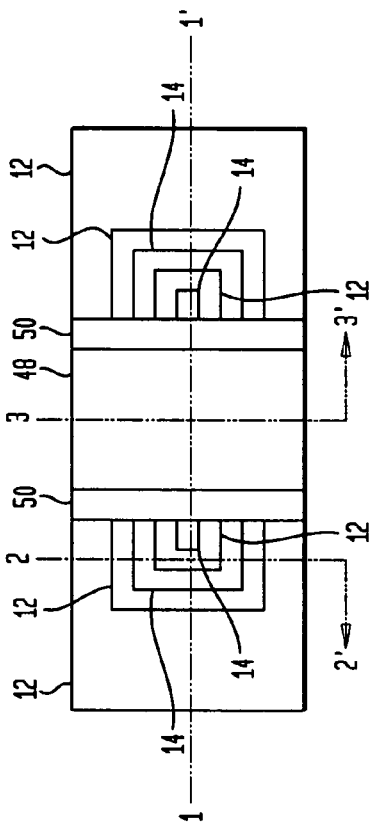
Figure 20C:
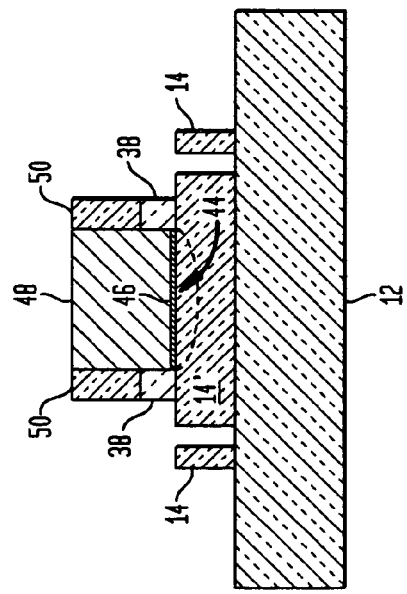
Figure 20B:
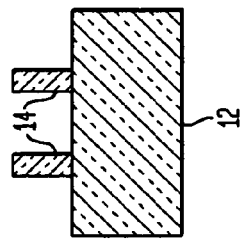
Figure 21A:
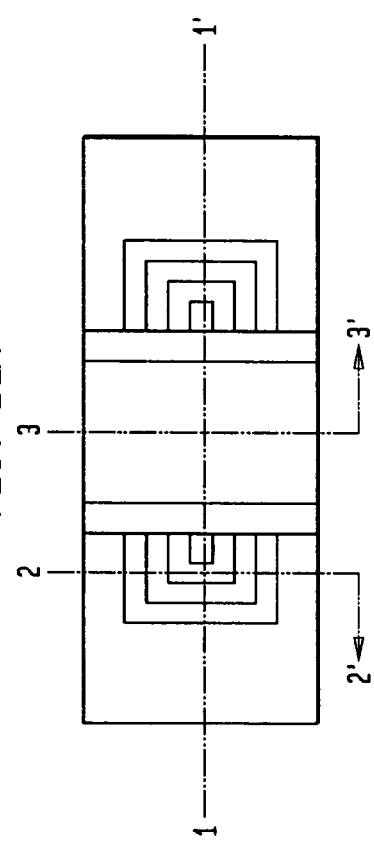
Figure 21D:
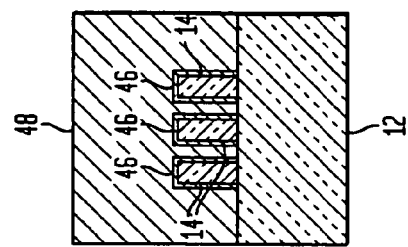
Figure 21C:
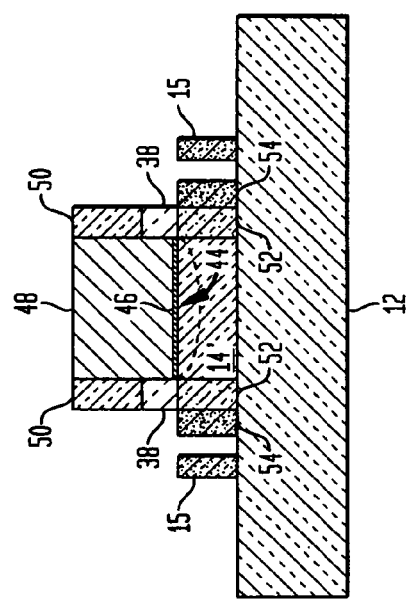
Figure 21B:
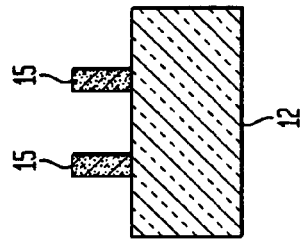
Figure 24D:
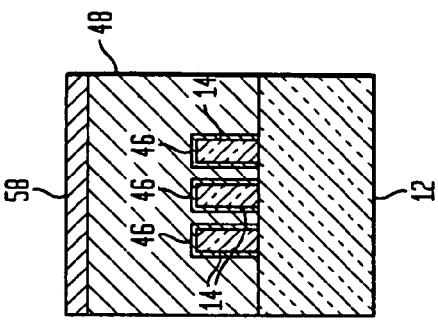
FIG. 24 is a pictorial representation showing an optional processing step of the first embodiment of the present invention.
Figure 24A:
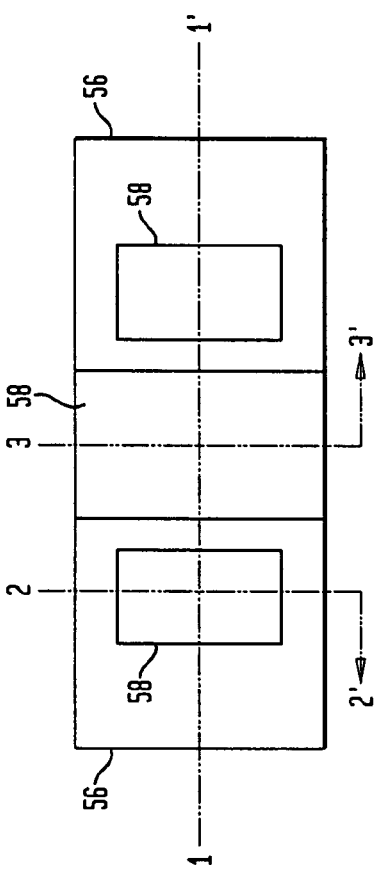
Figure 24C:
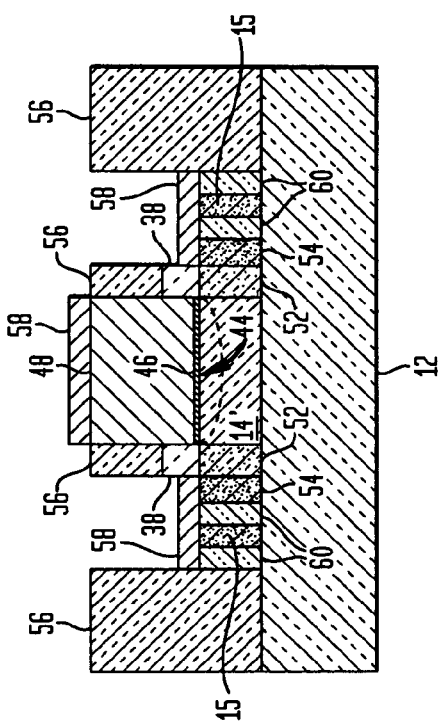
Figure 24B:
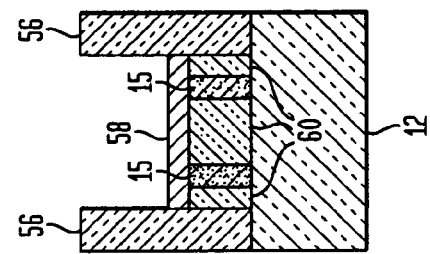
Figure 25A:
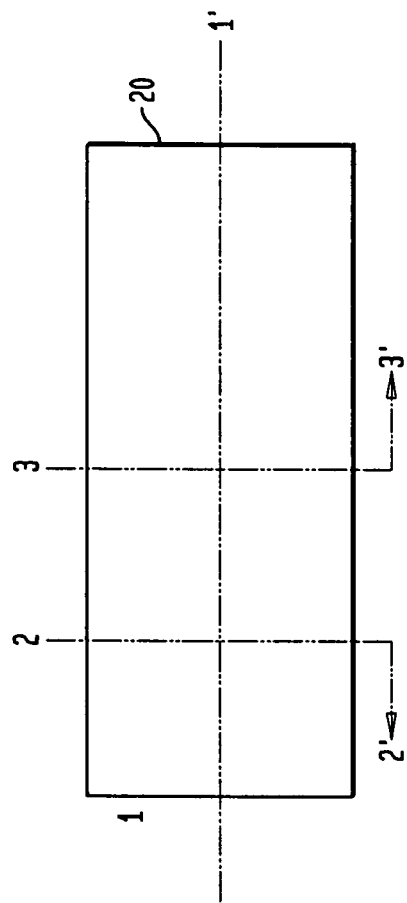
Figure 25D:
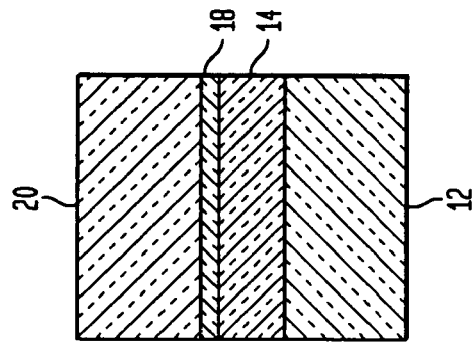
Figure 25C:
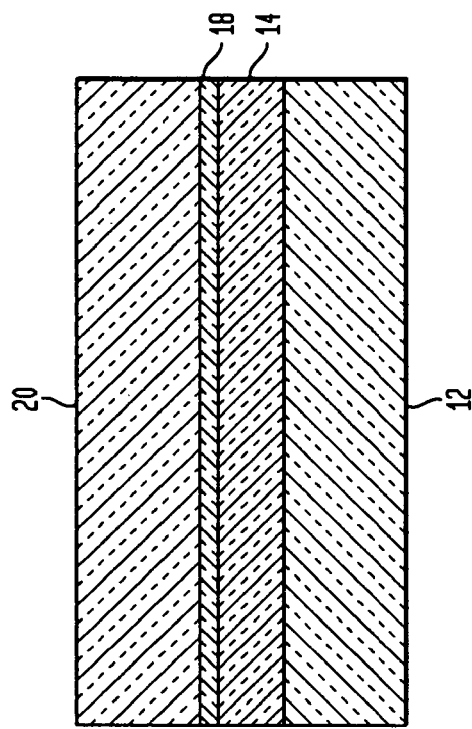
Figure 25B:
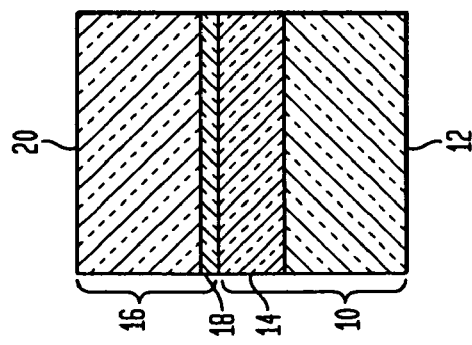
Figure 28A:
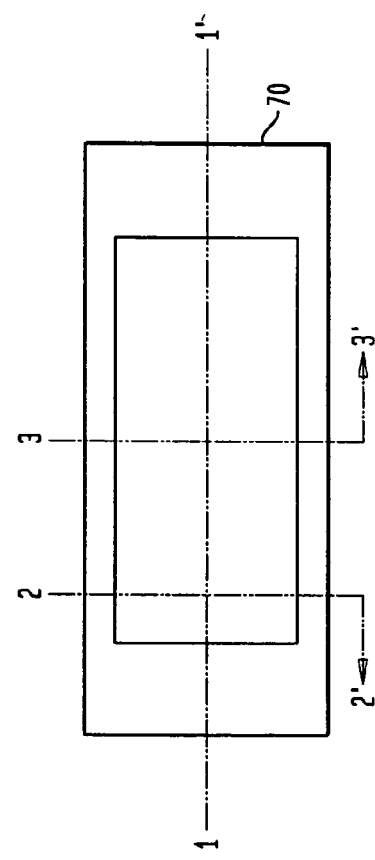
Figure 28B:
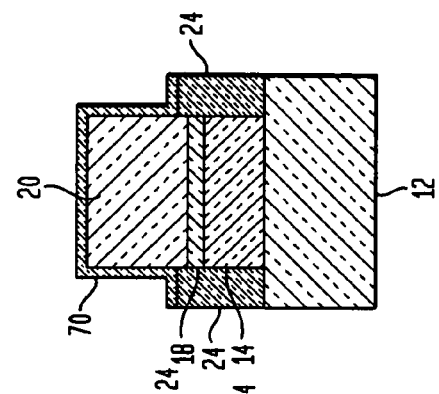
Figure 28C:
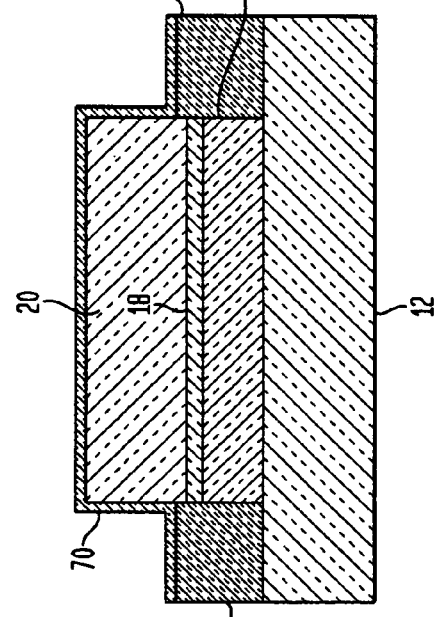
Figure 28D:
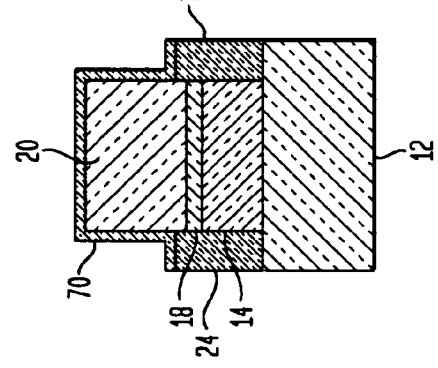
Figure 33A:
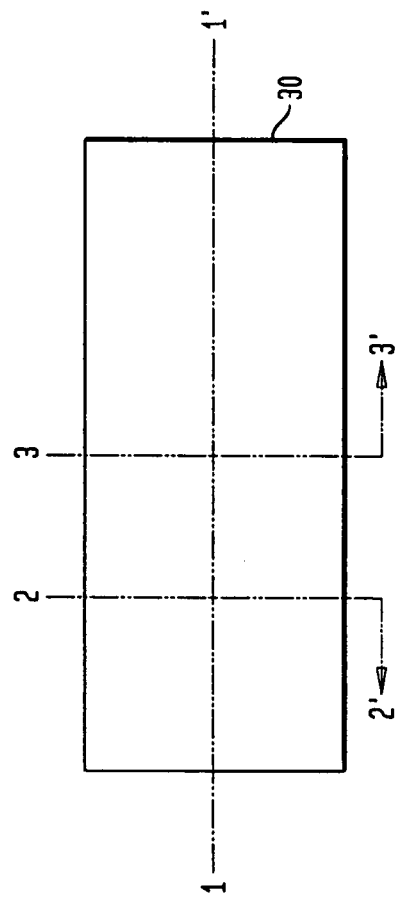
Figure 33B:
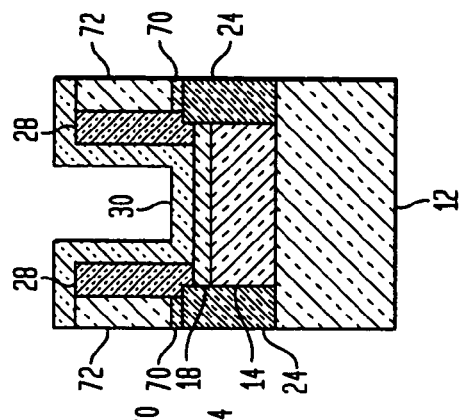
Figure 33C:
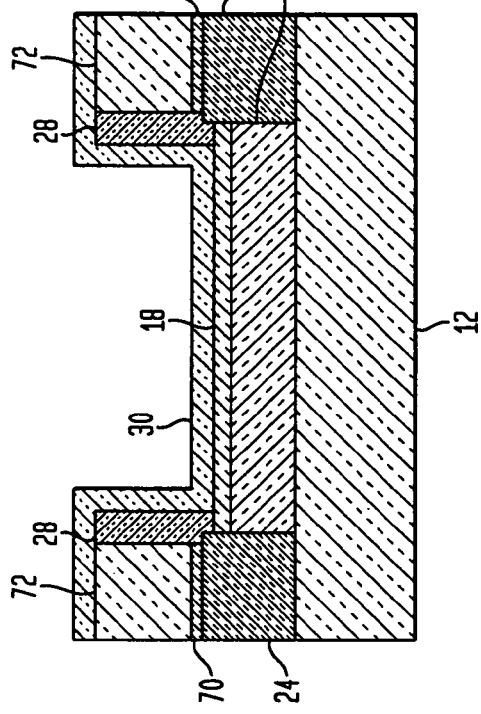
Figure 33D:
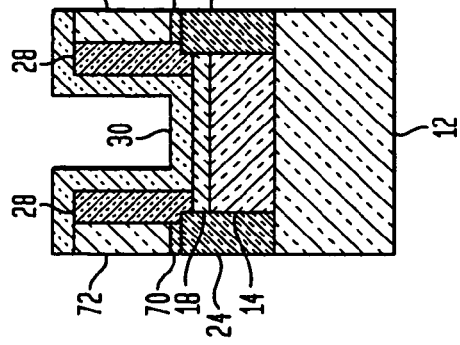
Figure 37A:
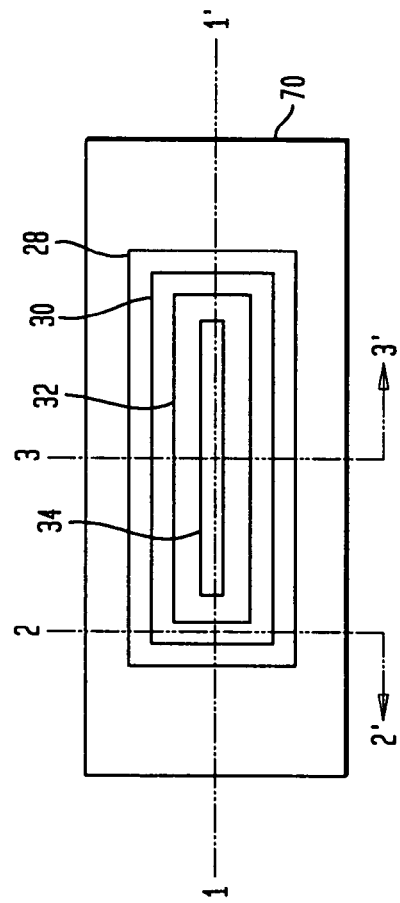
Figure 37D:
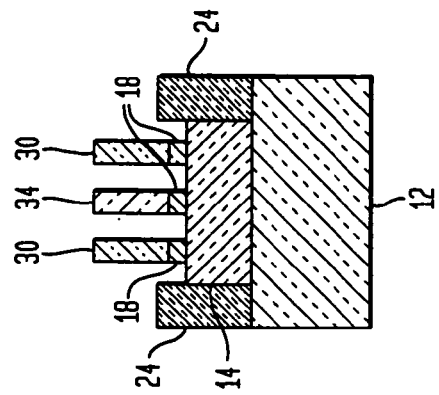
Figure 37C:
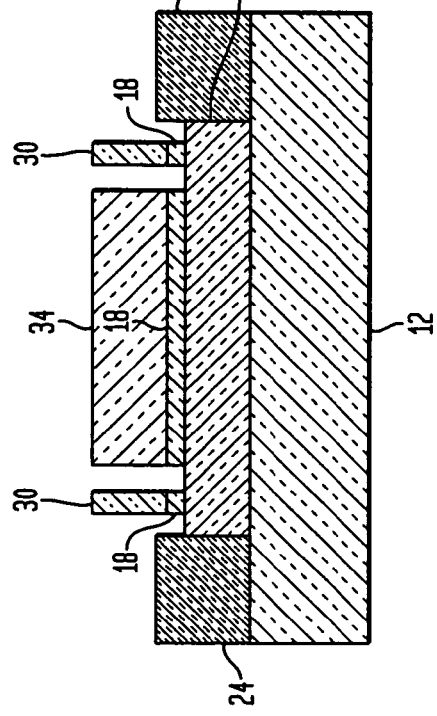
Figure 37B:
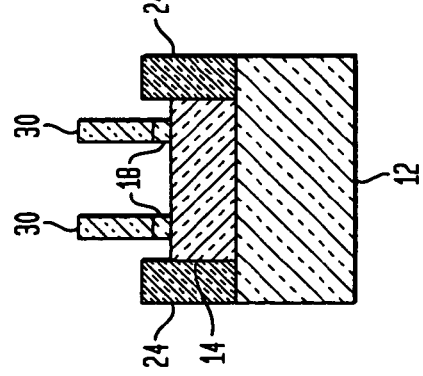
Figure 40D:
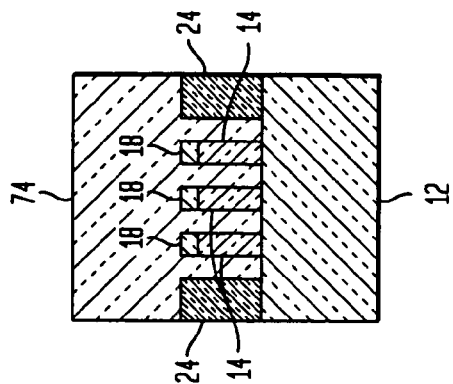
Figure 40A:
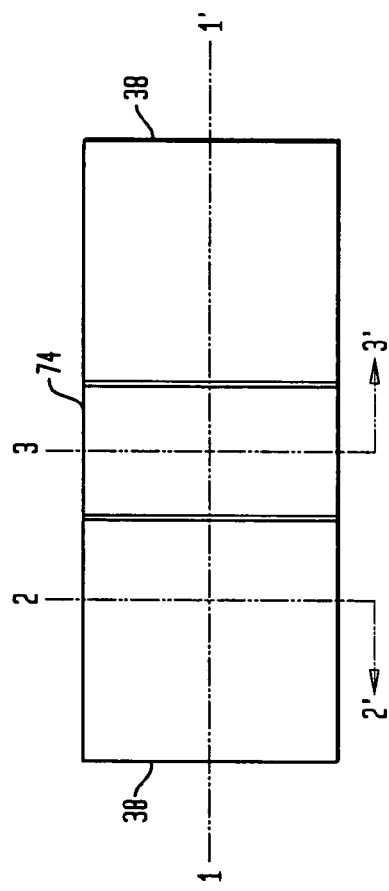
Figure 40C:
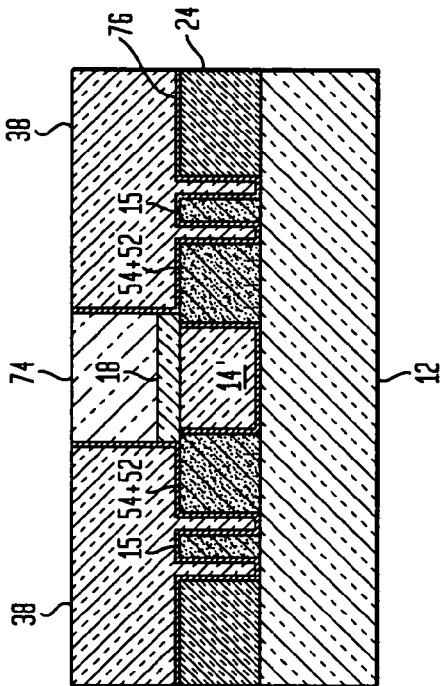
Figure 40B:
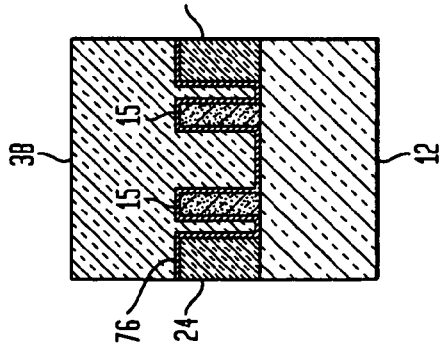
Figure 42A:
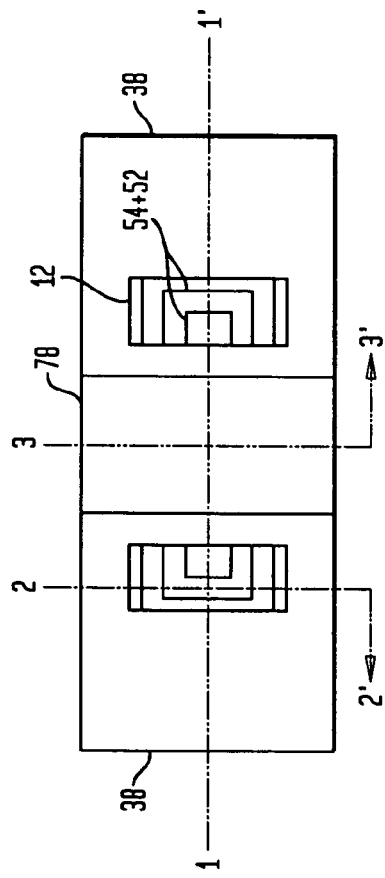
Figure 42D:
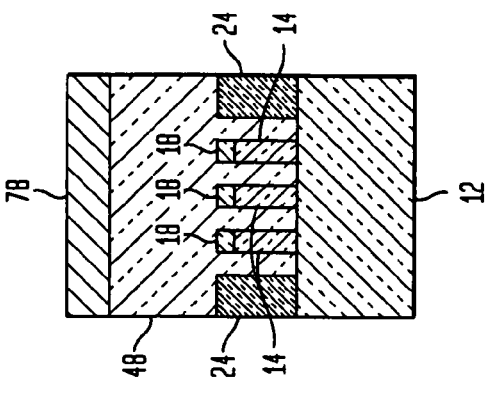
Figure 42C:
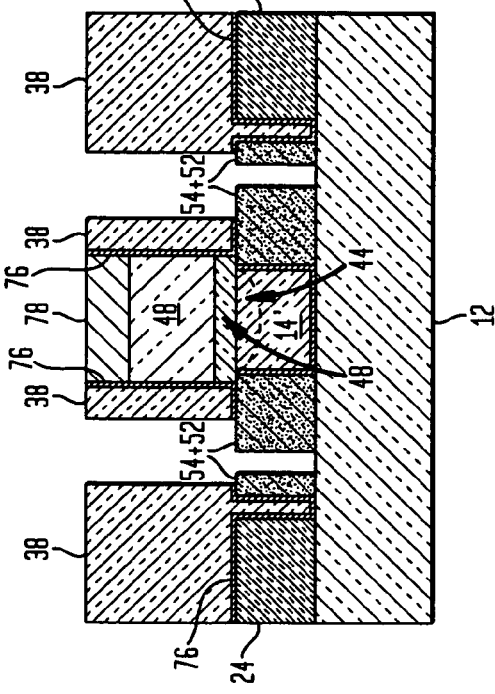
Figure 42B:
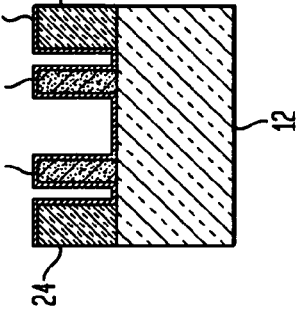

FIGS. 10–10D show an optional, but highly preferred embodiment of the first embodiment of the present invention after performing an optional planarization step and an optional a:Si RIE step. The optional planarization step includes chemical-mechanical polishing (CMP) or grinding. The a:Si RIE step lowers the height of the a:Si to a depth which is below the upper most surface of structure. That is, the a:Si RIE provides a structure having recessed a:Si layers 30 and 34.

To either the structure shown in FIGS. 9A–9D or FIGS. 10A–D, remaining portions of nitride layers 28 and 32 are removed utilizing a chemical wet etching process that is highly selective in removing nitride as compared with oxide or a:Si. Specifically, the chemical wet etching process used at this point of the present invention may include, for example, the use of hot phosphoric acid in a wet etch tank or equivalent tools as a chemical etchant. Note that this step of the present invention exposes portions of pad oxide layer 18. After wet etching the nitride layers from the structure, openings 36 are formed through exposed portions of pad oxide layer 16 stopping atop a surface of Si-containing layer 14. Specifically, the exposed portions of pad oxide layer 18 are removed utilizing an RIE process that is highly selective in removing oxide. The resultant structure which is formed after selectively removing nitride and oxide is shown, for example, in FIGS. 11A–D.

Next, and as shown in FIGS. 12A–D, remaining portions of a:Si layers 30 and 34 are removed at this point of the inventive process utilizing an RIE process that is highly selective in removing Si as compared to oxide. Note that regions of pad oxide layer 18 and Si-containing layer 14 remain in the structure. Some of the regions of Si-containing layer that remain form the base of the multi-mesa FET of the present invention. For instance, FIGS. 12A–D show the presence of mesa region 14'.

Following the removal of remaining portions of a:Si from the structure, dielectric material 38 is formed so as to provide the structure shown, for example, in FIGS. 13A–D. Specifically, dielectric material 38 is formed on all exposed surfaces of the structure shown in FIGS. 12A–D utilizing a conventional deposition process. Dielectric material 38 may comprise an oxide such as tetraethylorthosilicate (TEOS) or a silicate glass such as boron-doped-phosphorus silicate glass (BPSG) with a thin liner of impermeable material such as silicon nitride to prevent possible diffusion of dopants into the substrate. The thickness of dielectric material 38 is not critical to the present invention, but typically dielectric material 38 has a thickness of from about 100 to about 300 nm.

After formation of dielectric material 38, the dielectric material is planarized so as to provide the structure shown, for example, in FIGS. 14A–D. The planarization process used in forming the structure illustrated in FIGS. 14A–D includes CMP or grinding.

A patterned resist 40 is then formed atop the planarized surface of dielectric material 38 by conventional lithography. The patterned resist exposes a portion of underlying dielectric material 38 at a predetermined location in the structure wherein the MOSFET will be formed, i.e., at mesa region 14'. After resist patterning, gate openings 42 (one of which is shown in the drawings) are formed through exposed portions of dielectric material 38 as well as pad oxide 18 stopping atop a surface portion of the Si-containing layer, i.e., at mesa region 14'. A RIE process that is highly selective in removing oxide is employed in forming gate opening 42. The resultant structure that is formed after these steps of the present invention have been performed is shown, for example, in FIGS. 15A–D.

Following formation of the gate openings, the patterned resist is removed from the structure utilizing a conventional stripping process well-known to those skilled in the art. At this point of the present invention, channel region 44 is formed into the exposed portions of Si-containing mesa 14'. If desired, channel doping may be performed at this point using any known doping methods including, for example, gas phase doping, plasma doping, or even ion implantation. It should be noted that ion implantation will not deliver dopants uniformly, however, across the entire channel surface due to geometric shading of dopants during the process.

In some embodiments of present invention (not specifically shown), gate openings 42 are formed in two steps to allow the formation of a spacer along the inner walls of the dielectric material 38. This is done by stopping the etching of dielectric material 38 inside the opening 42 above the top of the silicon mesa or above pad oxide layer 18. The resist is then stripped, and a spacer is formed on the inner (gate side) sidewalls of dielectric material 38. Another resist layer can then be used to etch the rest of the dielectric material 38 from between the mesas and between the spacers. One skilled in this art will recognize that the use of two levels of photolithography can be reduced to one level of photolithography if a hardmask is used instead of resist 40. The resulting structure will have a built in spacer between the channel and the source/drain area to be exposed later in the scheme.

After formation of the channel region, gate dielectric 46 is formed on the exposed surface of the Si-containing layer which includes channel region 44. Gate dielectric 48 is formed utilizing a conventional thermal growing process. Alternatively, the gate dielectric may be formed by a conventional deposition process including, for example, CVD, plasma-assisted CVD or chemical solution deposition. The gate dielectric is a thin layer having a thickness of from about 1 to about 10 nm. The gate dielectric may be composed of a conventional oxide such as, but not limited to: $SiO_2$, $Al_2O_3$, $Ta_2O_3$, $TiO_2$, and perovskite-type oxides. The resultant structure after formation of gate dielectric 46 is shown, for example, in FIGS. 16A–D. Note that the gate dielectric is wrapped around pillars of Si-containing layer 14; See FIG. 14D.

Following formation of the gate dielectric, gate conductor 48 is formed over portions of the gate dielectric that overlays channel region 44, See FIGS. 17A–D. The gate conductor which is composed of a conductive material including, for example, doped polysilicon, a silicide, an elemental metal or any combination thereof is formed by a conventional deposition process such as CVD. When polysilicon is employed, the polysilicon gate is either doped in-situ during the deposition process, or alternatively, the polysilicon gate can be doped after deposition using conventional ion implantation and annealing. In another embodiment, the polysilicon gate can be doped at the same time as formation of the source/drain regions. If needed, the gate may be subjected to an optional planarization step after deposition or after deposition and doping. Note that implantation of the gate conductor is performed utilizing a masked ion implantation process so as to form at least one NMOS or PMOS FET region. The opposite conductivity type region will be formed later on in the process. Note that channel region 44, gate dielectric 46, and gate conductor 48 form a gate region of the present invention.

A mask, not shown, is then formed atop the gate conductor, and thereafter exposed portions of dielectric material 38 are removed stopping when the surface of the dielectric material is co-planar with STI regions 24. The removal step includes the use of a timed RIE process that is highly selective in removing oxide as compared to gate conductor. For example, $C_4H_8$ chemistry may be employed in selectively removing dielectric material 38. The resultant structure that is formed after these steps have been performed is shown in FIGS. 18A–D. Note that vertical portions of gate conductor 48 are now exposed.

Spacers 50 are then formed about the exposed vertical sidewalls of gate conductor 48 so as to provide the structure shown, for example, in FIGS. 19A–D. The spacers are preferably composed of a nitride or oxynitride, but oxide spacers may be employed provided that the gate conductor's height is engineered so that some dielectric material remains at the foot of the gate conductor. The spacers are formed by deposition and etching.

The resist covering the gate conductors are then removed utilizing a conventional resist stripping process and any remaining dielectric material including dielectric material 38 and STI regions 24 are removed from the structure so as to provide the structure shown in FIGS. 20A–D.

Next, the structure shown in FIGS. 20A–D is subjected to a gas phase plasma doping process, plasma doping process, and/or an angled ion implant process to form doped source/drain diffusion regions, and optionally, to form doped source/drain extensions. Note that the regions are formed into sidewall portions of each mesa region formed above. FIGS. 21A–D shows an example where both the source/drain and their extensions are formed. It is possible, however, to omit the formation of the source/drain extensions.

In these drawings, reference numeral 52 denotes lightly doped regions, while reference numeral 54 denotes a heavily doped (as compared to region 52) region. Reference numeral 15 is used herein to denote the doping of Si-containing layer 14. The term "lightly doped region" is commonly referred to as source/drain extension and denotes a region that has a doping concentration of less than or about $5 \times 10^{19}$ atoms/cm$^3$ or less, while the term "heavily doped region" denotes a region having a dopant concentration greater than $5 \times 10^{19}$ atoms/cm$^3$. Doped regions 52 and 54 together form the source/drain regions of the structure. To those skilled in the art, it should be obvious that a moderate wet etch may be employed to fine-tune the position of the source/drain extension for optimal FET performance.

As indicated before, the use of gas phase doping or plasma doping is preferred in the present invention because the uniformity of the doping performed with these doping methods is not limited by geometry, that is, all the exposed surface gets the same level of doping. In either case, the dopant moves in the gas phase or in plasma even to the bottom of the space between mesas and the same or similar amount of dopant is delivered into the silicon across the exposed sidewall surfaces. Use of ion implantation will create non-uniform doping profile, but in the case of very shallow mesas may suffice without too much adverse effects on uniformity of threshold voltage and sub-threshold voltage characteristics.

Following formation of doped regions 52 and 54, oxide layer 56 is formed on the structure by a conventional deposition process and the oxide layer is planarized to provide the planar structure shown in FIGS. 22A–D. A complementary mask is used to mask the other conductivity type FET areas and the processing steps shown in FIGS. 18–22 are repeated. This forms the opposite conductivity type FET in the structure. Note in each case, the FET is formed atop a Si-containing mesa.

Next, and as shown in FIGS. 23A–D, silicide contacts 58 are formed in the structure about the gate region (as well as atop gate conductor 48) utilizing a conventional silicidation process. In an optional embodiment, see FIGS. 24A–D, the source/drain region can be filled with a:Si and then implanted via a masked implant process. Region 60 denotes doped polysilicon that is formed after a:Si deposition and etching. Silicide contacts 58 are formed utilizing a conventional silicidation process as discussed above. It is noted that silicide contacts 58 may be replaced with non-silicide contacts for certain devices.

At the stage of FIGS. 23A–D or FIGS. 24A–D, depending on the nature of the desired device characteristics, the spacing between the mesas may be filled with any material, such as a dielectric, polysilicon, silicide, or a metal.

The above description and FIGS. 1–24 illustrate a first embodiment of the present invention wherein gate damascene processing is employed. The following description and FIGS. 25–42 illustrate a second embodiment of the present invention wherein damascene gate replacement processing is employed. The second embodiment of the present invention allows for the use of high-k dielectrics and metallic gate conductors since the normal thermal budget associated with gate oxidation and source/drain anneals has been eliminated.

Reference is first made to the initial structure shown in FIGS. 25A–D which includes SOI wafer 10 (including Si-containing substrate, buried insulating layer 12, and Si-containing layer 14) and pad stack 16 (including pad oxide 18 and hardmask 20). Note that this initial structure is identical to the structure shown in FIGS. 1A–D, therefore the above remarks made in regard to FIGS. 1A–D are incorporated herein by reference. Although all illustrations are done on an SOI substrate, it should be clear that implementation on conventional bulk substrate requires virtually no modification and is straightforward.

FIGS. 26A–D and FIGS. 27A–D show the formation of trenches 22 and STI regions 24, respectively. Note that these drawings are identical to FIGS. 2A–D and FIGS. 3A–D; therefore the above remarks concerning FIGS. 2A–D and 3A–D are incorporated herein by reference as well.

Next, and as shown in FIGS. 28A–D, STI regions 24 are recessed and nitride layer 70 is formed on all the exposed surfaces of the structure. Nitride layer 70, which serves as an etch stop layer, is formed by a conventional deposition process, such as CVD. The thickness of nitride layer 70 may vary and is not critical to the present invention. For illustrative purposes only, the thickness of nitride layer 70 is typically from about 5 to about 50 nm.

After forming nitride layer 70 on the structure, oxide layer 72 is deposited and planarized so as to provide the structure shown in FIGS. 29A–D. Note that portions of nitride layer 70 that are located on the horizontal surface of hardmask 20 are exposed. Next, the exposed portions of nitride layer 72 and the underlying hardmask 20 are removed from the structure utilizing a wet etch process that is highly selective in removing nitride as compared with oxide. The etching step stops atop pad oxide layer 18. The resultant structure formed after this step of the present invention is shown, for example, in FIGS. 30A–D. Note that device aperture 26 is formed at this point of the present invention and that vertical portions of nitride layer 70 that were formed around hardmask 20 are also removed at this point of the present invention.

FIGS. 31A–D through FIGS. 35A–D illustrate different structures that are formed after nitride layer 28 deposition and RIE, a:Si 30 deposition and RIE, nitride layer 32 deposition and RIE, and a:Si layer 34 deposition and RIE, respectively. Note that these processes used during this sequence of steps are the same as those mentioned in regard to FIGS. 5–9; therefore the processing steps described in conjunction with FIGS. 5–9 apply equally well for this embodiment of the present invention.

FIGS. 36A–D show the structure that is formed after planarization (CMP or grinding), oxide RIE and a:Si RIE. The planarization step and a:Si RIE are optional, but the oxide RIE, which removes oxide layer 72, is required. The oxide RIE includes the use of RIE chemistry that is highly selective in removing oxide, while the optional a:Si RIE uses RIE chemistry that is highly selective in removing Si. Note that the etching stops atop nitride layer 70

Next, remaining nitride (layers 28, 32 and 70) are removed from the structure utilizing a chemical wet etching process that is highly selective in removing nitride. The resultant structure is shown, for example, in FIGS. 37A–D. Note that the some portions of pad oxide layer 18 are now left exposed. It is emphasized that during nitride removal portions of pad oxide layer 18 may be thinned.

Openings 36 are formed by utilizing an oxide RIE process. The oxide RIE process removes exposed oxide, in particular pad oxide 18, from the structure so as to expose Si-containing layer 14. Note that mesa 14' is now formed at this point invention. Following formation of openings 36, remaining portions of a:Si layers 30 and 34 are removed as discussed above in the first embodiment of the present invention providing the structure shown, for example, in FIGS. 38A–D. Note that some of the patterned Si-containing layers serve as the mesa region where FET devices will be subsequently formed.

The structure shown in FIGS. 38A–D is then subjected to an oxidation process which forms a thin oxide layer about the exposed wall portions of Si-containing layer 14. The thin oxide layer is not separately shown or labeled in the drawings of the present invention. An a:Si layer 74 is then deposited providing the structure illustrated in FIGS. 39A–D. NFET and PFET masks (not shown) are then applied sequentially to open source/drain regions in the a:Si. While the source/drain doping for NFETS are defined, the PFETs are protected by the a:Si layer. Note that the a:Si layer 74 does not necessarily have to be a:Si but it can also be a polysilicon layer, or a layer of any material that reasonably fills the spaces between mesas, be patterned with photolithography, and be etched away selective to doped or undoped silicon dioxide. In the present invention layer 74 can be referred as a mesa fill material.

FIGS. 40A–D show the structure that is formed after performing the following sequence of steps: First, apply NFET mask and etch a:Si layer 74 that is exposed. The exposed area corresponds to the source and drain area of the NFET. Next, strip the thin oxide and use gas phase plasma doping, plasma doping and/or angled ion implantation to form the source/drain regions. Dielectric material 38, such as silicon dioxide is then formed by deposition, for example by decomposition of TEOS in a CVD reactor. Alternatively, a thin SiN liner 76 is then formed by deposition and then dielectric material 38 is deposited. After deposition of the dielectric material, the structure is planarized and then a short SiN RIE process is performed. Note that SiN spacers can be additionally formed on the sidewalls of a:Si layer 74 prior to fill with dielectric material 38. This permits the formation of borderless diffusion contacts.

The PFET mask is applied and the a:Si (in the PFET regions) are defined and the then above mentioned processing steps mentioned in regard to FIGS. 40A–D are performed.

FIGS. 41A–D show the structure that is formed after the following sequence of processing steps are performed. First, the a:Si is removed using a conventional etching process and then channel region 44 is defined by channel doping as discussed above. As with the first embodiment of the present invention, the channel doping may include the use of sacrificial spacers. Next, pad oxide is removed and gate dielectric 46 is formed on the now exposed surface of channel region 44. In the second embodiment of the present invention, conventional dielectrics as well as high-k dielectrics, such as tantalum pentoxide, barium strontium titanate and yttrium silicate, may be used. The term high-k dielectric is used herein to denote a dielectric material having a dielectric constant of 10 or greater. After formation of gate dielectric 46, gate conductor 48 is formed atop the gate dielectric. The gate may be planarized, recessed and a SiN cap 78 may optionally be formed atop the recessed gate conductor. In this embodiment, metallic gate conductors may be used.

FIGS. 42A–D show the structure which is formed after the following processing steps are performed: First, open contact vias to SiN layer 76 utilizing an etching process that selectively removes dielectric material 38, and thereafter opening SiN layer 76 utilizing an etching process that is highly selective in removing nitride. Silicide contacts (or non-silicide contacts) 58 are then formed as discussed above.

At the stage of FIGS. 42A–D, depending on the nature of the desired device characteristics, the spacing between the mesas may be filled with any material, such as a dielectric, polysilicon, silicide, or a metal.

It is noted that the present invention provides a wrapped gate dielectric in which the gate fills the spaces between pairs of narrow Si mesa. Therefore, the effective width of the FETs is increased manifold compared with previous methods of forming wrapped around structures.

Unlike the prior art methods, the present methods described herein allow doping of the source and drain directly on the sidewalls of the mesa. Furthermore, the preferred doping methods, do not limit the height of the mesa for threshold voltage control reasons.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A method of forming a damascene gate field effect transistor (FET) structure comprising the steps of:
    providing a planar structure comprising a pad stack located atop a Si-containing semiconductor layer;
    removing portions of the pad stack to define at least one device aperture in said structure;
    forming at least one mesa region comprising a portion of said Si-containing semiconductor layer in said at least one device aperture, said at least one mesa region having sidewall portions;
    forming a dielectric material having an opening that exposes a portion of said at least one mesa region;
    forming a first gate region including a channel region, gate dielectric and gate conductor in said opening, said channel region being formed into said at least one mesa region, while said gate dielectric and gate dielectric being formed on said at least one mesa region;
    removing said dielectric material about said gate region and forming spacers on exposed vertical sidewalls of said gate conductor; and
    forming source and drain regions in said sidewall portions of said at least one mesa region, wherein solid source and drain regions are formed by a gas phase doping process, a plasma doping process, angled ion implantation, or a combination thereof.

2. The method of claim 1 further comprising removing said dielectric material about said gate region in two stages after the gate is formed, said two stages comprising the steps of first removing said dielectric material over the sidewall portions of said at least one mesa region to a height above the top of the at least one mesa region; forming spacers on exposed vertical sidewalls of the said gate conductor; and removing remaining dielectric material over the source and drain area to completely expose the sidewall portions of said at least one mesa region.

3. The method of claim 1 further comprising forming a second gate region of opposite plurality of said first gate region in other mesa regions by forming one type of FET after another, where within each iteration the area not containing the particular type of FET is blocked with an etch resistant and CMP resistant hardmask, which is discarded after each iteration.

4. The method of claim 1 further comprising forming silicide or non-silicide contacts atop of the at least one mesa region which includes the source and drain region.

5. The method of claim 1 wherein spacers are formed in said opening prior to forming said channel region, said spacers are formed by first removing said dielectric material over the channel region to a height above the top of the at least one mesa region; forming spacers on exposed vertical sidewalls of the dielectric material; and removing the dielectric material over the at least one mesa region to expose the sidewall portions.

6. The method of claim 1 wherein said at least one device aperture is filled with alternating layers of two materials, one being resistant to an etch chemistry and the other easily etched by the said etch chemistry, said alternating layers being used in defining the at least one mesa region.

7. A method of forming a field effect transistor comprising the steps of:
    providing a planar structure comprising a patterned pad stack located atop a surface of Si-containing semiconductor layer, said patterned pad stack surrounded by shallow trench isolation regions which extend into said Si-containing layer;
    lining said structure including said patterned pad stack with a nitride layer;
    providing an oxide layer that is coplanar with a surface of said nitride layer that is located atop an upper surface of said patterned pad stack and removing said nitride layer and a portion of said patterned pad stack to form at least one device aperture;
    forming at least one mesa region including at least a portion of said Si-containing semiconductor layer in said at least one device aperture, said at least one mesa region including sidewall portions;
    forming a mesa fill material on a portion of said at least one mesa region;
    forming source and drain regions in said sidewall portions of said at least one mesa region, wherein said source and drain regions are formed by a gas phase doping process, a plasma doping process, angled ion implantation, or a combination thereof;
    removing the mesa fill material to expose a portion of said at least one mesa region; and
    forming a first gate region including a channel region, gate dielectric and gate conductor on said exposed portion of said at least one mesa region, said channel region being formed into said at least one mesa region, while said gate dielectric and gate dielectric being formed on said at least one mesa region.

8. The method of claim 7 further comprising forming a second gate region of opposite plurality of said first gate region in other mesa regions by sequentially doping the source and drain regions of each type, where within each iteration, exposing the source and drain for one type of FET, and doping the exposed source and drain regions, and, filling up the volume above the exposed source and drain by depositing dielectric and planarizing such that the top of the dielectric surface is level with the top surface of said dielectric fill material.

9. The method of claim 7 further comprising a processing step between the formation of the shallow trench isolation and formation of at least one device aperture, said processing step comprising removing said shallow trench isolation regions partially and lining said structure including said pad stack with a silicon nitride layer or a layer of material that is resistant to wet etch chemistry of silicon dioxide; and providing a second silicon dioxide layer that is coplanar with a surface of said nitride layer that is located atop an upper surface of said pad stack and removing said nitride layer and a portion of said pad stack to form at least one device aperture.

10. The method of claim 7 wherein said gate dielectric is a high-k dielectric having a dielectric constant of about 10 or greater.

11. The method of claim 7 further comprising forming silicide or non-silicide contacts on the exposed mesa structure in the source and in the drain.

12. The method of claim 7 further comprising filling spaces between the at least one mesa region within the sidewall portions with an insulator material or a conducting material.

13. A method of forming a damascene gate field effect transistor (FET) structure comprising the steps of:

providing a planar structure comprising a pad stack located atop a Si-containing semiconductor layer;

removing portions of the pad stack to define at least one device aperture in said structure wherein said at least one device aperture is filled with alternating layers of two materials, one being resistant to an etch chemistry and the other easily etched by the said etch chemistry, said alternating layers being used in defining at least one mesa region;

forming said at least one mesa region comprising a portion of said Si-containing semiconductor layer in said at least one device aperture, said at least one mesa region having sidewall portions;

forming a dielectric material having an opening that exposes a portion of said at least one mesa region;

forming a first gate region including a channel region, gate dielectric and gate conductor in said opening, said channel region being formed into said at least one mesa region, while said gate dielectric and gate dielectric being formed on said at least one mesa region;

removing said dielectric material about said gate region and forming spacers on exposed vertical sidewalls of said gate conductor; and forming source and drain regions in said sidewall portions of said at least one mesa region.

* * * * *